US010359793B2

(12) United States Patent
Kim et al.

(10) Patent No.: US 10,359,793 B2
(45) Date of Patent: Jul. 23, 2019

(54) METHOD AND CIRCUIT FOR CONTROLLING OSCILLATOR AND APPARATUS EMPLOYING THE SAME

(71) Applicant: SAMSUNG ELECTRONICS CO., LTD., Suwon-si, Gyeonggi-Do (KR)

(72) Inventors: Woo-Seok Kim, Suwon-si (KR); Tae-Ik Kim, Seongnam-si (KR); Ji-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 142 days.

(21) Appl. No.: 15/683,896

(22) Filed: Aug. 23, 2017

(65) Prior Publication Data
US 2018/0150089 A1 May 31, 2018

(30) Foreign Application Priority Data
Nov. 30, 2016 (KR) .................. 10-2016-0162306

(51) Int. Cl.
| | | |
|---|---|---|
| *H03B 5/04* | (2006.01) | |
| *H03K 3/03* | (2006.01) | |
| *H03L 1/02* | (2006.01) | |
| *H03L 5/00* | (2006.01) | |
| *H03K 3/011* | (2006.01) | |
| *G05F 1/46* | (2006.01) | |
| *H03L 7/085* | (2006.01) | |

(52) U.S. Cl.
CPC .............. *G05F 1/463* (2013.01); *H03B 5/04* (2013.01); *H03K 3/011* (2013.01); *H03K 3/0315* (2013.01); *H03L 1/022* (2013.01); *H03L 5/00* (2013.01); *H03L 7/085* (2013.01)

(58) Field of Classification Search
CPC ........ H03K 3/011; H03K 3/0315; H03L 1/00; H03L 1/02; H03L 1/021; H03L 5/00
See application file for complete search history.

(56) References Cited

U.S. PATENT DOCUMENTS

| 5,661,428 | A * | 8/1997 | Li ........................ G05F 3/242 323/313 |
| 8,258,880 | B2 * | 9/2012 | Koh ...................... H03K 3/011 331/176 |
| 2004/0108521 | A1 * | 6/2004 | Lim ..................... G11C 11/406 257/200 |
| 2010/0327952 | A1 * | 12/2010 | Wu .................. H03K 19/00369 327/513 |
| 2013/0134788 | A1 * | 5/2013 | Noguchi .................. H02J 1/00 307/75 |

OTHER PUBLICATIONS

"Analytical and Experimental Methods for Zero-Temperature-Coefficient Biasing of MOS Transistors," Electronic Letters, Aug. 17, 1989 vol. 25 No. 17, pp. 1196-1198.

* cited by examiner

*Primary Examiner* — Ryan Johnson
(74) *Attorney, Agent, or Firm* — Volentine, Whitt & Francos, PLLC

(57) ABSTRACT

An oscillator control circuit includes a zero-temperature coefficient (ZTC) estimator estimating a ZTC voltage based on a supply voltage supplied to the oscillator and a frequency of an oscillation signal output by the oscillator. The ZTC voltage is the magnitude of the supply voltage VDD which corresponds to the ZTC condition for the oscillator. The ZTC estimator generates a bias control signal such that the magnitude of the supply voltage becomes the ZTC voltage.

20 Claims, 23 Drawing Sheets

METHOD AND CIRCUIT FOR CONTROLLING OSCILLATOR AND APPARATUS EMPLOYING THE SAME

CROSS-REFERENCE TO RELATED APPLICATION

This application claims the benefit of Korean Patent Application No. 10-2016-0162306, filed on Nov. 30, 2016, in the Korean Intellectual Property Office, the disclosure of which is incorporated herein by reference in its entirety.

BACKGROUND

The inventive concept relates to an oscillator, and more particularly, to a circuit for controlling an oscillator, an apparatus including the same, and a method of controlling an oscillator.

Oscillators generating oscillation signals are used for various purposes, for example, as clock sources. An oscillation signal of an oscillator may be required to have a desired period or frequency, and when an oscillation signal is used for a signal such as a clock signal required to maintain a constant frequency, it may be necessary that the frequency of the oscillation signal is maintained to be constant. The frequency of the oscillation signal may vary due to variations in a process by which the oscillator is manufactured, or a voltage or temperature at which the oscillator operates, and it may be difficult and expensive to accurately compensate for such factors affecting the frequency.

SUMMARY

The inventive concept provides a circuit for controlling an oscillator to generate an oscillation signal of a constant frequency, an apparatus including the same, and a method of controlling an oscillator.

According to an aspect of the inventive concept, there is provided an oscillator control circuit including a zero-temperature coefficient (ZTC) estimator which is configured to estimate a ZTC voltage based on a supply voltage supplied to the oscillator and a frequency of an oscillation signal output by the oscillator, wherein the ZTC voltage is a supply voltage of an oscillator satisfying a ZTC condition of the oscillator, and wherein the ZTC estimator is configured to generate a bias control signal such that the magnitude of the supply voltage becomes the ZTC voltage.

According to another aspect of the inventive concept, there is provided an apparatus including: a zero-temperature coefficient (ZTC) estimator which is configured to generate a bias control signal; an oscillator which is configured to output an oscillation signal; and a bias circuit which is configured to supply voltage to the oscillator based on the bias control signal, wherein the ZTC estimator is configured to estimate a ZTC voltage based on the supply voltage and a frequency of the oscillation signal, and to generate the bias control signal such that a magnitude of the supply voltage becomes the ZTC voltage, wherein the ZTC voltage is a value of the magnitude of the supply voltage of the oscillator satisfying a ZTC condition of the oscillator.

According to another aspect of the inventive concept, there is provided a method including: controlling a supply voltage supplied to an oscillator and acquiring a frequency of an oscillation signal output by the oscillator in response to the supply voltage; estimating a zero-temperature coefficient (ZTC) voltage based on the supply voltage and the frequency of the oscillation signal, wherein the ZTC voltage is a value of a magnitude of the supply voltage of the oscillator corresponding to a ZTC condition of the oscillator; and generating a bias control signal such that the magnitude of the supply voltage becomes the ZTC voltage.

According to yet another aspect of the invention there is provided a device comprising: a signal output which is configured to output a supply voltage to an oscillator; a signal input which is configured to receive an oscillation signal from the oscillator; and a control circuit configured to supply to the signal output the supply voltage having a magnitude of an estimated zero-temperature coefficient (ZTC) voltage for the oscillator, wherein the estimated ZTC voltage is an estimated value of the magnitude of the supply voltage of the oscillator which causes the oscillator to operate in a ZTC condition.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
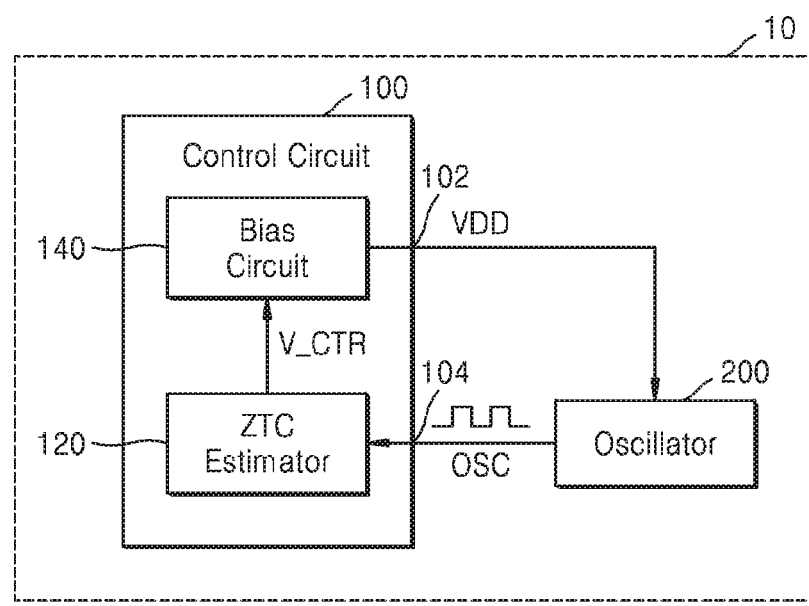
FIG. 1 is a block diagram of an embodiment of a system including an oscillator control circuit.
Figure 2:
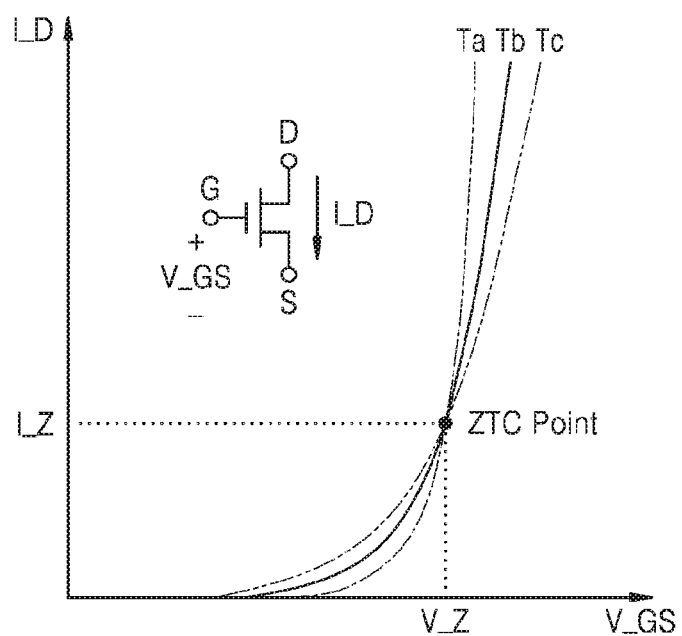
FIG. 2 is a graph illustrating an example of a temperature-dependent change in a characteristic of a transistor.

FIG. 1 is a block diagram of an embodiment of a system 10 including an oscillator control circuit 100. FIG. 2 is a graph illustrating an example of a temperature-dependent change in a characteristic of a transistor. System (or apparatus) 10 may be, for example, an integrated circuit in which oscillator control circuit 100 and an oscillator 200 are integrated and then formed in one die through a semiconductor process, or an electronic system including a printed circuit board mounted with oscillator control circuit (or control circuit) 100 and oscillator 200. For example, system 10 may be, but is not limited to, a digital signal processing system such as a personal computer (PC), a network server, a tablet PC, a mobile phone, a smartphone, a wearable apparatus, or a memory system. As illustrated in FIG. 1, system 10 may include control circuit 100 and oscillator 200.

A device including control circuit 100 may include a signal output 102 which is configured to output a supply voltage VDD to oscillator 200 and a signal input 104 which is configured to receive an oscillation signal OSC from oscillator 200. Oscillator 200 may include one or more devices (e.g., transistors) operated by the power supplied from the supply voltage VDD, and may generate the oscillation signal OSC. As described below, based on the supply voltage VDD and a frequency of the oscillation signal OSC corresponding to the supply voltage VDD, control circuit 100 may control the supply voltage VDD which is supplied to oscillator 200 such that oscillator 200 may generate the oscillation signal OSC of a constant frequency despite an environmental (e.g., process, voltage, or temperature) variation. Although FIG. 1 illustrates that system 10 includes only control circuit 100 and oscillator 200, system 10 may further include one or more functional blocks which operate by receiving the oscillation signal OSC generated by oscillator 200. After a desired frequency (i.e., a predetermined target frequency) of the oscillation signal OSC is reached, control circuit 100 may transmit a signal indicating the availability of the oscillation signal OSC to one or more functional blocks receiving the oscillation signal OSC, and the functional blocks may operate in response to the signal received from control circuit 100 by using the received oscillation signal OSC. Referring to FIG. 1, control circuit 100 may include a zero-temperature coefficient (ZTC) estimator 120 and a bias circuit 140. ZTC estimator 120 may receive the oscillation signal OSC and in response thereto may generate a bias control signal V_CTR and provide the same to bias circuit 140.

ZTC estimator 120 may estimate the value of the magnitude of the supply voltage VDD which corresponds to a ZTC condition of oscillator 200, based on the supply voltage VDD and the frequency of the oscillation signal OSC. The ZTC condition may refer to a condition in which oscillator 200 outputs the oscillation signal OSC of a constant frequency regardless of temperature, and may be due to a characteristic of the transistor included in oscillator 200, and the magnitude of the supply voltage VDD which corresponds to the ZTC condition is referred to as the ZTC voltage V_ZTC.

Referring to FIG. 2, a metal oxide semiconductor (MOS) transistor may have a characteristic in which a drain current I_D increases as a gate voltage V_GS increases. Also, a level of change of the drain current I_D according to the increase of the gate voltage V_GS may be different at each of different temperatures Ta, Tb, and Tc, but a point where the magnitudes of the drain current I_D and the gate voltage V_GS are equal at each of the different temperatures Ta, Tb, and Tc may be observed. That is, as illustrated in FIG. 2, when the magnitude of the gate voltage V_GS is 'V_Z', the magnitude of the drain current I_D of the MOS transistor may be 'I_Z' regardless of the different temperatures Ta, Tb, and Tc. Thus, a condition in which the MOS transistor has the gate voltage V_GS of a constant magnitude and the drain current I_D of a constant magnitude regardless of the temperature may be referred to as a ZTC condition, and an operating point of the transistor satisfying the ZTC condition may be referred to as a ZTC point.

As described below with reference to FIGS. 8A, 8B, and 9, oscillator 200 may include a plurality of MOS transistors and may generate the oscillation signal OSC according to an operating condition of the MOS transistors. For example, a ring oscillator may include a plurality of inverters, and each of the inverters may include MOS transistors connected in common to a line to which a supply voltage VDD and a ground voltage are supplied as illustrated in FIG. 8B. Test results show that ZTC conditions of the MOS transistors included in oscillator 200 are substantially constant. Accordingly, ZTC estimator 120 may estimate the ZTC condition of oscillator 200 and control oscillator 200 through the bias control signal V_CTR such that oscillator 200 operates at the ZTC condition, thereby allowing oscillator 200 to output the oscillation signal OSC having a constant frequency regardless of a temperature variation. According to an embodiment, ZTC estimator 120 may estimate the ZTC condition of oscillator 200 through a digital operation, and thus a high accuracy and a low cost may be simultaneously achieved. Details of the operation of ZTC estimator 120 will be described below with reference to FIGS. 3A and 3B.

In response to the bias control signal V_CTR received from ZTC estimator 120, bias circuit 140 may generate the supply voltage VDD and provide the same to oscillator 200. For example, bias circuit 140 may receive power from a terminal exposed outside system 10 or a power device included in system 10, and may adjust the magnitude of the supply voltage VDD from the received power according to the bias control signal V_CTR. According to an embodiment, bias circuit 140 may receive the bias control signal V_CTR that is a digital signal and may adjust the supply voltage VDD, for example, by using a digital-to-analog converter (DAC), so as to control the supply voltage VDD.

The oscillation signal OSC may have a frequency varying according to the magnitude of the supply voltage VDD supplied to oscillator 200. For example, as the magnitude of the supply voltage VDD supplied to oscillator 200 increases, the magnitude of a current supplied to a device (e.g., transistor) included in oscillator 200 may increase, and thus the frequency of the oscillation signal OSC may increase due to the increased operation speed (or response speed) of the device. As described above, when the supply voltage VDD has a magnitude allowing oscillator 200 to maintain the ZTC condition estimated by ZTC estimator 120, the oscillation signal OSC may have a constant frequency regardless of a temperature variation.

Figure 3A:
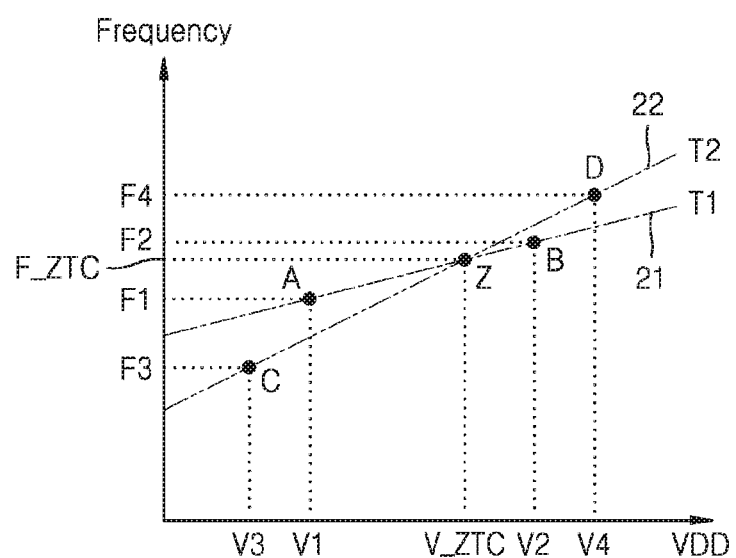
FIGS. 3A and 3B are graphs and tables illustrating an operation of an embodiment of a zero-temperature coefficient (ZTC) estimator of FIG. 1.
Figure 3B:
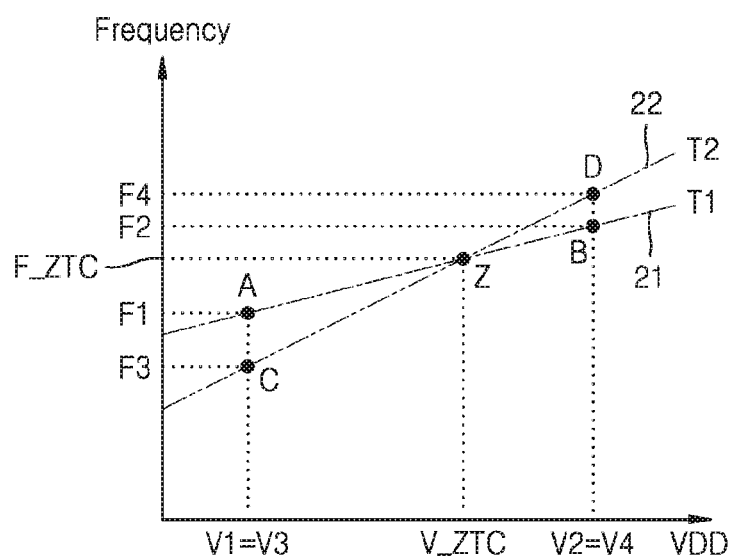

FIGS. 3A and 3B are graphs and tables illustrating an operation of an embodiment of ZTC estimator 120 of FIG. 1. As described above with reference to FIGS. 1 and 2, ZTC estimator 120 may estimate the magnitude of the supply voltage VDD satisfying the ZTC condition of oscillator 200 (i.e., V_ZTC) based on the supply voltage VDD and the frequency of the oscillation signal OSC. Hereinafter, FIGS. 3A and 3B will be described with reference to FIG. 1.

Referring to FIG. 3A, according to an embodiment, ZTC estimator 120 may supply the supply voltage VDD having with the magnitude two or more different values to oscillator 200 at each of two or more different temperatures of oscillator 200, and may estimate the ZTC voltage V_ZTC based on two or more frequencies of the oscillation signal corresponding respectively to the two or more different values of the magnitude of the supply voltage VDD. For example, as illustrated in FIG. 3A, ZTC estimator 120 may generate the bias control signal V_CTR such that the magnitude of the supply voltage VDD becomes a first voltage V1 and a second voltage V2 at different times at a first temperature T1. Also, ZTC estimator 120 may generate the bias control signal V_CTR such that the magnitude of the supply voltage VDD becomes a third voltage V3 and a fourth voltage V4 at different times at a second temperature T2. As illustrated in the graph of FIG. 3A, the second voltage V2 may be greater than the first voltage V1 and the fourth voltage V4 may be greater than the third voltage V3.

ZTC estimator 120 may acquire a first frequency F1 of the oscillation signal OSC output by oscillator 200 with the first temperature T1 when the magnitude of the supply voltage VDD is the first voltage V1, and may acquire a second frequency F2 of the oscillation signal OSC output by oscillator 200 with the first temperature T1 when the magnitude of the supply voltage VDD is the second voltage V2. Also, ZTC estimator 120 may acquire a third frequency F3 of the oscillation signal OSC output by the oscillator 200 with the second temperature T2 when the magnitude of the supply voltage VDD is the third voltage V3, and may acquire a fourth frequency F4 of the oscillation signal OSC output by oscillator 200 with the second temperature T2 when the magnitude of the supply voltage VDD is the fourth voltage V4.

ZTC estimator 120 may estimate a ZTC voltage V_ZTC based on the first to fourth frequencies F1 to F4 and the first to fourth voltages V1 to V4. Again, the ZTC voltage V_ZTC is the value of the magnitude of the supply voltage VDD which corresponds to the ZTC condition of oscillator 200, As illustrated in the graph of FIG. 3A, in the graph having respective axes for the magnitude of the supply voltage VDD and the frequency of the oscillation signal OSC, a first line 21 formed by a point A of the first voltage V1 and the first frequency F1 and a point B of the second voltage V2 and the second frequency F2 may be derived, and a second line 22 formed by a point C of the third voltage V3 and the third frequency F3 and a point D of the fourth voltage V4 and the fourth frequency F4 may be derived. ZTC estimator 120 may calculate or determine a cross point, or intersection point, Z between the first and second lines 21 and 22 as the ZTC point and may determine the magnitude of the supply voltage VDD corresponding to the cross point Z as the ZTC voltage V_ZTC. As illustrated in FIG. 3A, when the magnitude of the supply voltage VDD is the ZTC voltage V_ZTC, the frequency of the oscillation signal OSC output by oscillator 200 may remain constant as F_ZTC, regardless of a temperature variation.

Referring to FIG. 3B, according to an embodiment, ZTC estimator 120 may share the magnitude of the supply voltage VDD used at the first temperature T1 and the second temperature T2. As illustrated in FIG. 3B, ZTC estimator 120 may derive four points A, B, C, and D by using two voltages V1 and V2 and may derive the cross point Z from the four points A, B, C, and D. That is, according to an example of FIG. 3B, the first and third voltages V1 and V3 may be equal to each other and the second and fourth voltages V2 and V4 may be equal to each other. In the example of FIG. 3B, the ZTC voltage V_ZTC corresponding to the cross point Z may be calculated by Equation 1 below.

$$V\_ZTC = \frac{(V2-V1)\cdot(F3-F1)}{(F3-F1)+(F2-F4)} + V1 \qquad \text{Equation 1}$$

Figure 4A:
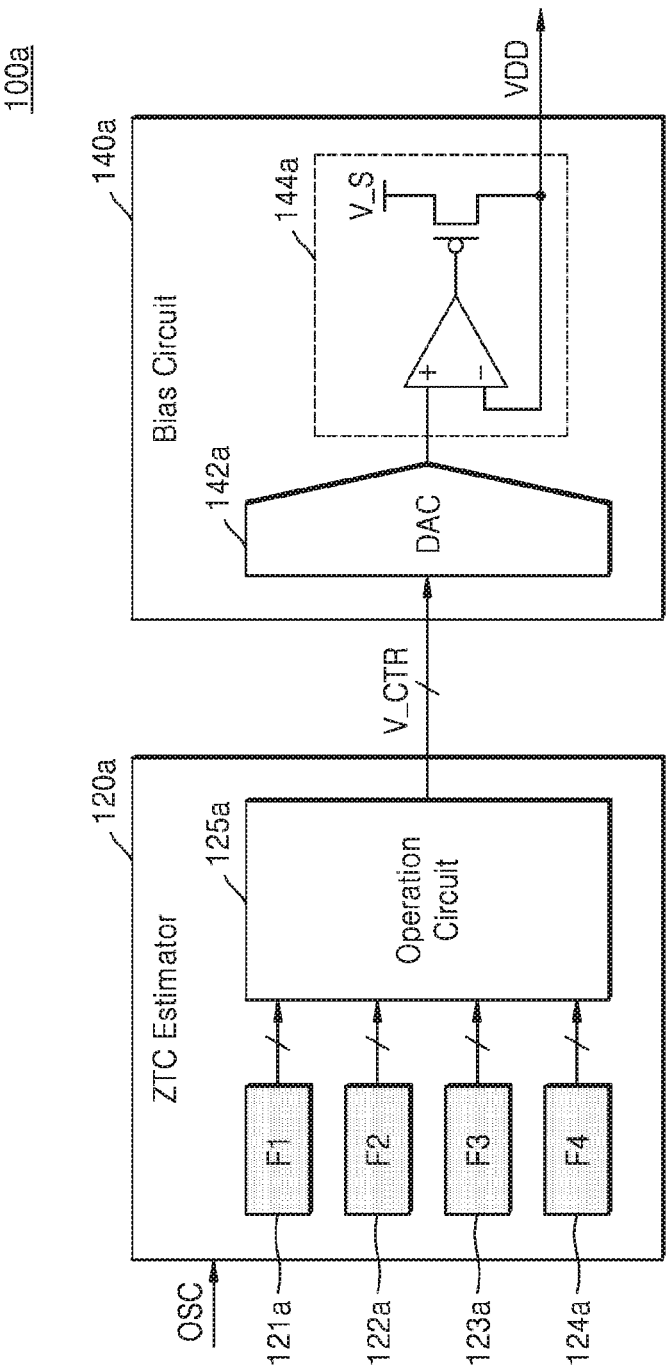
FIGS. 4A and 4B are block diagrams of example embodiments of the control circuit of FIG. 1.
Figure 4B:
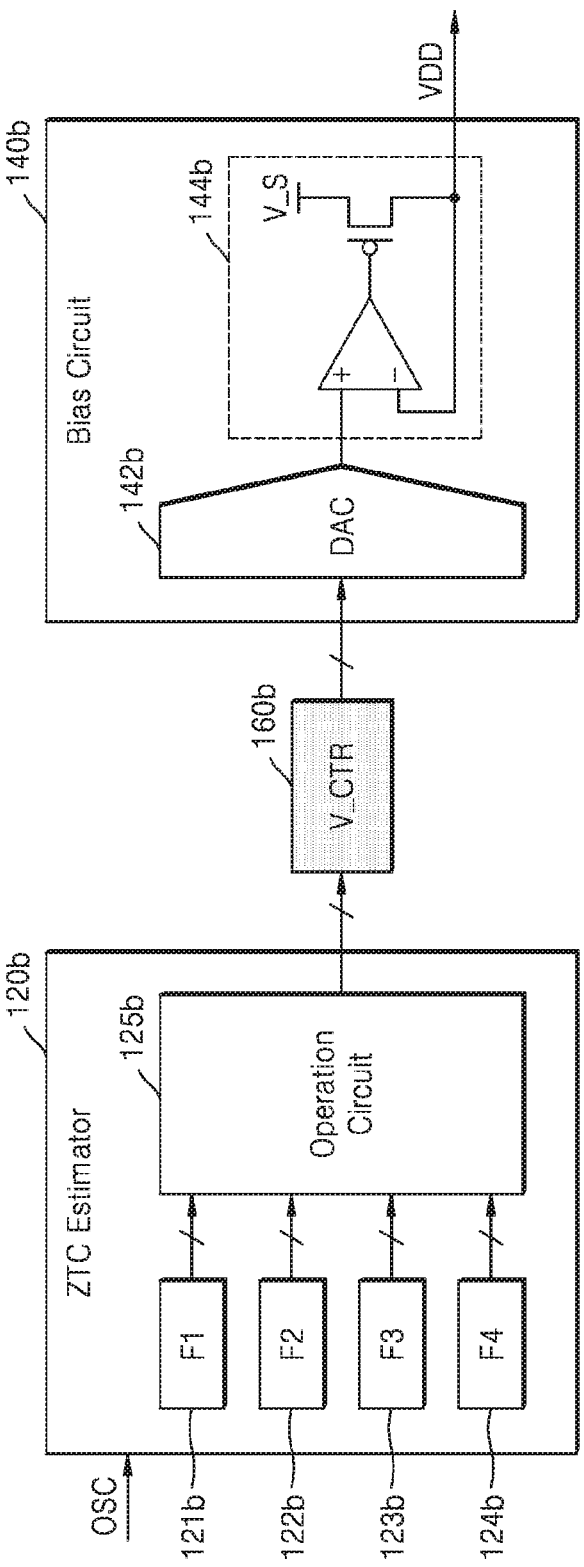

FIGS. 4A and 4B are block diagrams of example embodiments of control circuit 100 of FIG. 1. As described above with reference to FIG. 1, a control circuit 100a of FIG. 4A or a control circuit 100b of FIG. 4B may also provide the supply voltage VDD to oscillator 200 based on the oscillation signal OSC received from oscillator 200. Hereinafter, in the description of FIGS. 4A and 4B, redundant descriptions will be omitted for conciseness.

Referring to FIG. 4A, control circuit 100a may include a ZTC estimator 120a and a bias circuit 140a. ZTC estimator 120a may receive the oscillation signal OSC and may output the bias control signal V_CTR. Bias circuit 140a may receive the bias control signal V_CTR and may output the supply voltage VDD.

ZTC estimator 120a may include first to fourth storage devices 121a to 124a and an operation circuit 125a. First to fourth storage devices 121a to 124a may respectively store four frequencies of the oscillation signal OSC according to corresponding different values for the magnitude of the supply voltage VDD. For example, as illustrated in FIG. 4A, first to fourth storage devices 121a to 124a may respectively store first to fourth frequencies F1 to F4. Each of first to fourth storage devices 121a to 124a may be any device storing information. In an embodiment, each of first to fourth storage devices 121a to 124a may include at least one of a latch, a flip-flop, and a register, and may include a volatile memory device such as a dynamic random access memory (DRAM) or a static random access memory (SRAM). In another embodiment, each of first to fourth storage devices 121a to 124a may include a nonvolatile memory device such as an anti-fuse memory, an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM). When first to fourth storage devices 121a to 124a include nonvolatile memory devices, even when the power is interrupted and then resupplied to control circuit 100a (or system 10 of FIG. 1), the ZTC voltage V_ZTC may be calculated by operation circuit 125a from the first to fourth frequencies F1 to F4 stored in first to fourth storage devices 121a to 124a, as described below. That is, when the first to fourth frequencies F1 to F4 are stored in first to fourth storage devices 121a to 124a, the ZTC voltage V_ZTC may be calculated even without an operation of acquiring the first to fourth frequencies F1 to F4 from the oscillation signal OSC.

Operation circuit 125a may calculate the ZTC voltage V_ZTC based on the first to fourth frequencies F1 to F4 stored in first to fourth storage devices 121a to 124a. For example, as described above with reference to FIGS. 3A and 3B, operation circuit 125a may calculate the ZTC voltage V_ZTC from a cross point between: (1) a first line (e.g., 21 of FIG. 3A) formed by the first and second voltages V1 and V2 and the first and second frequencies F1 and F2; and (2) a second line (e.g., 22 of FIG. 3A) formed by the third and fourth voltages V3 and V4 and the third and fourth frequencies F3 and F4. For example, operation circuit 125a may be a processor including a core executing a plurality of instructions, or may be a logic circuit designed through logic synthesis. Operation circuit 125a may generate the bias control signal V_CTR based on the calculated ZTC voltage V_ZTC and may provide the same to bias circuit 140a.

According to an embodiment, operation circuit 125a may generate the value of the bias control signal V_CTR for the ZTC voltage V_ZTC by using the values of the bias control signal V_CTR corresponding to the first to fourth voltages V1 to V4, instead of using the first to fourth voltages V1 to V4 themselves. As illustrated in FIG. 4A, the bias control signal V_CTR may be a digital signal (e.g., a multi-bit signal) provided to a DAC 142a of bias circuit 140a. DAC 142a may output a voltage having a magnitude proportional to the value of the bias control signal V_CTR, and the magnitude of the supply voltage VDD may be determined by the output of DAC 142a. That is, in each of the graphs of FIGS. 3A and 3B, the horizontal axis may represent the value of the bias control signal V_CTR (e.g., the value of the multi-bit signal) instead of the magnitude of the supply voltage VDD.

Bias circuit 140a may include DAC 142a and a buffer 144a. DAC 142a may receive the bias control signal V_CTR and may output a voltage of a magnitude proportional to the value of the bias control signal V_CTR. Since bias circuit 140a includes DAC 142a, the ZTC condition, that is, the ZTC voltage V_ZTC may be calculated by operation circuit 125a through a digital operation. Since the temperature variation of oscillator 200 is compensated for by using operation circuit 125a having a simple structure and occupying a small area, instead of by using complex analog circuits, a temperature characteristic of oscillator 200 may be accurately compensated for at a low cost.

Buffer 144a may output the supply voltage VDD having the same magnitude as the voltage output by DAC 142a. Buffer 144a may supply a current to oscillator 200 by forming a current path from a source voltage V_S to the supply voltage VDD. A structure of buffer 144a illustrated in FIG. 4A is merely an example, and it will be understood that buffer 144a may have various structures different from the structure illustrated in FIG. 4A.

Referring to FIG. 4B, control circuit 100b may include a ZTC estimator 120b, a bias circuit 140b, and a storage device 160b. ZTC estimator 120b may generate the bias control signal V_CTR and may store the value of the bias control signal V_CTR in storage device 160b. Like first to fourth storage devices 121b to 124b, storage device 160b may include a volatile memory device or may include a nonvolatile memory device. When storage device 160b includes a nonvolatile memory device, the value of the bias control signal V_CTR corresponding to the ZTC voltage V_ZTC may be maintained even when the power is interrupted and then resupplied to control circuit 100b. Thus, the magnitude of the supply voltage VDD may be made equal to the ZTC voltage V_ZTC even without an operation of acquiring the first to fourth frequencies F1 to F4 from the oscillation signal OSC and storing the same in first to fourth storage devices 121b to 124b, and without an operation of calculating the first to fourth frequencies F1 to F4 performed by an operation circuit 125b.

Figure 5A:
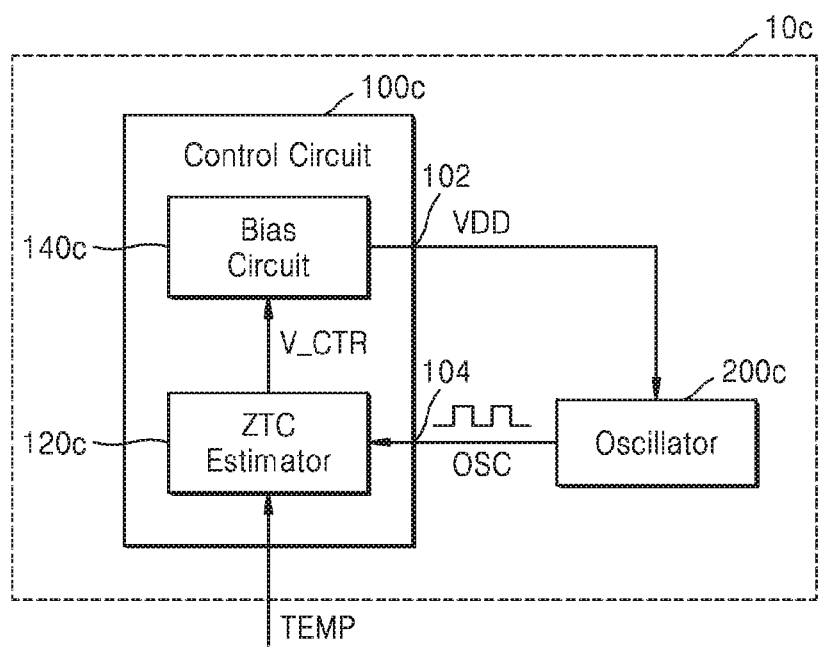
FIGS. 5A and 5B are block diagrams of embodiments of a system.
Figure 5B:
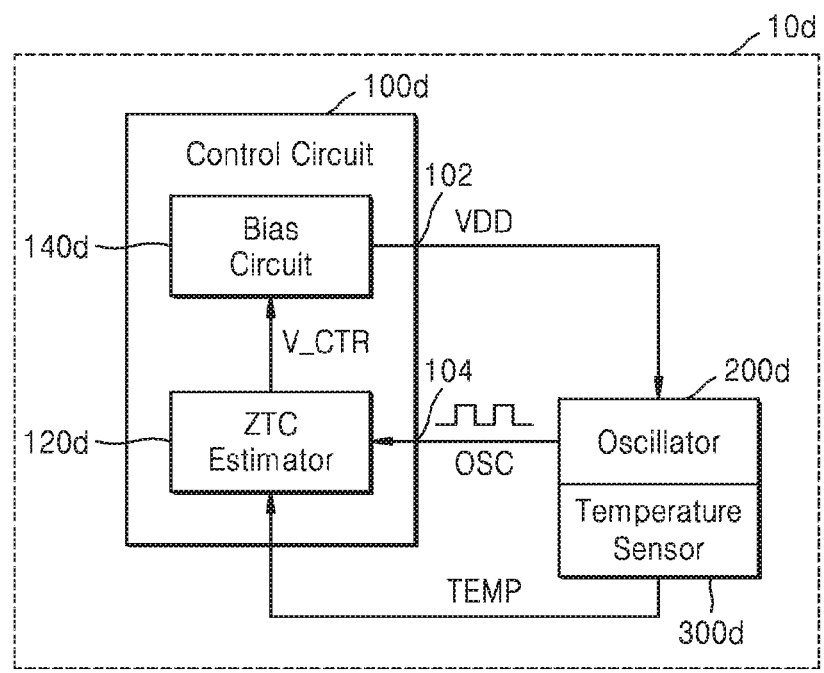

FIGS. 5A and 5B are block diagrams of embodiments of a system. As illustrated in FIGS. 5A and 5B, a ZTC estimator 120c or 120d of a control circuit 100c or 100d may receive a temperature signal TEMP and may recognize the temperature of an oscillator 200c or 200d (e.g., the first temperature T1 or the second temperature T2 of FIGS. 3A and 3B) based on the temperature signal TEMP. In FIGS. 5A and 5B, in order to represent each of two different temperatures, the temperature signal TEMP may be a signal (e.g., a 1-bit signal) representing only a temperature level, or may be a signal (e.g., a multi-bit signal) capable of representing various temperatures. Hereinafter, in the description of FIGS. 5A and 5B, redundant descriptions will be omitted for conciseness.

Referring to FIG. 5A, a system 10c may include a control circuit 100c and an oscillator 200c, and control circuit 100c may include a ZTC estimator 120c and a bias circuit 140c. As illustrated in FIG. 5A, ZTC estimator 120c may recognize the temperature of oscillator 200c based on the temperature signal TEMP received from outside system 10c. For example, in a process of manufacturing system 10c or oscillator 200c, ZTC estimator 120c may receive the temperature signal TEMP representing the temperature of oscillator 200c from manufacturing equipment. In order to calculate the ZTC voltage V_ZTC of ZTC estimator 120c, the manufacturing equipment may maintain system 10c or oscillator 200c at the first temperature T1 and may provide the temperature signal TEMP representing the first temperature T1 to ZTC estimator 120c. ZTC estimator 120c may recognize the first temperature T1 from the temperature signal TEMP, may generate the bias control signal V_CTR such that the magnitude of the supply voltage becomes the first and second voltages V1 and V2, and may acquire the first and second frequencies F1 and F2. Thereafter, the manufacturing equipment may maintain system 10c or oscillator 200c at the second temperature T2 and may provide the temperature signal TEMP representing the second temperature T2 to ZTC estimator 120c. ZTC estimator 120c may recognize the second temperature T2 from the temperature signal TEMP and may acquire the third and fourth frequencies F3 and F4 similarly to how it acquired first and second frequencies F1 and F2.

Referring to FIG. 5B, a system 10d may include a control circuit 100d, an oscillator 200d, and a temperature sensor 300d. Temperature sensor 300d may be adjacent to oscillator 200d and may sense a temperature of oscillator 200d to output the temperature signal TEMP. That is, unlike in the example of FIG. 5A, in the example of FIG. 5B, a ZTC estimator 120d may receive the temperature signal TEMP generated within system 10d.

As illustrated in FIG. 5B, when system 10d includes temperature sensor 300d, and ZTC estimator 120d receives the temperature signal TEMP from temperature sensor 300d, ZTC estimator 120d may dynamically calculate the ZTC voltage V_ZTC. For example, ZTC estimator 120d may calculate the ZTC voltage V_ZTC even after system 10d is manufactured and shipped. In this case, as described below with reference to FIG. 14, ZTC estimator 120d may estimate the difference between the first temperature T1 at which the first and second frequencies F1 and F2 are acquired and the second temperature T2 at which the third and fourth frequencies F3 and F4 are to be acquired, and may perform an operation for acquiring the third and fourth frequencies F3 and F4 when the difference between the first and second temperatures T1 and T2 is greater than a reference value.

Figure 6A:
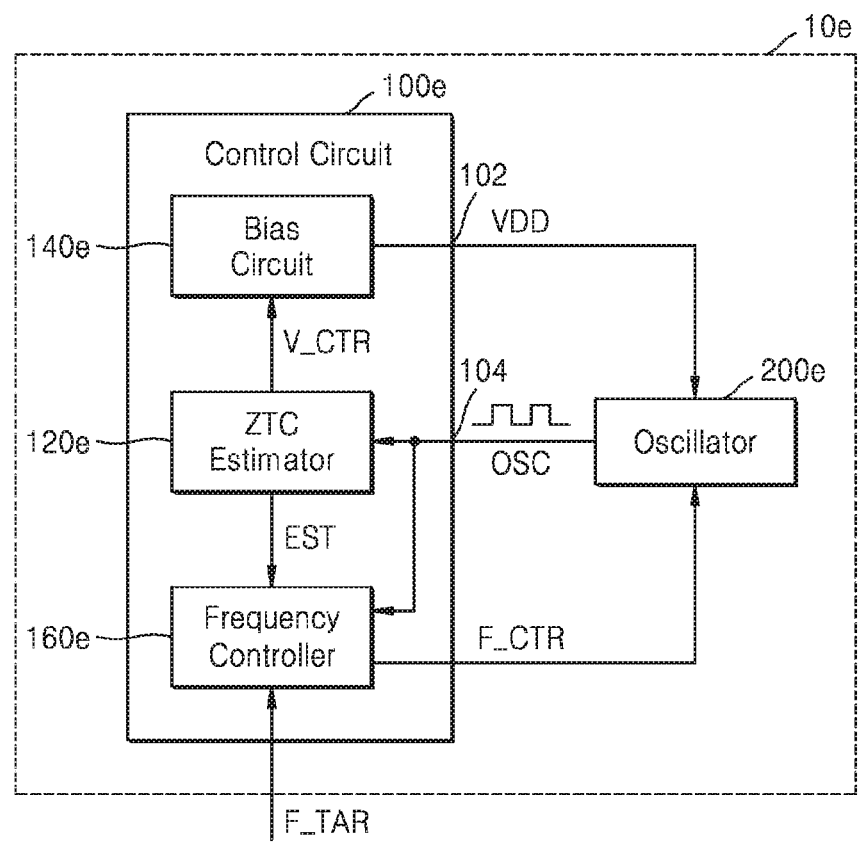
FIGS. 6A and 6B are block diagrams of embodiments of a system.
Figure 6B:
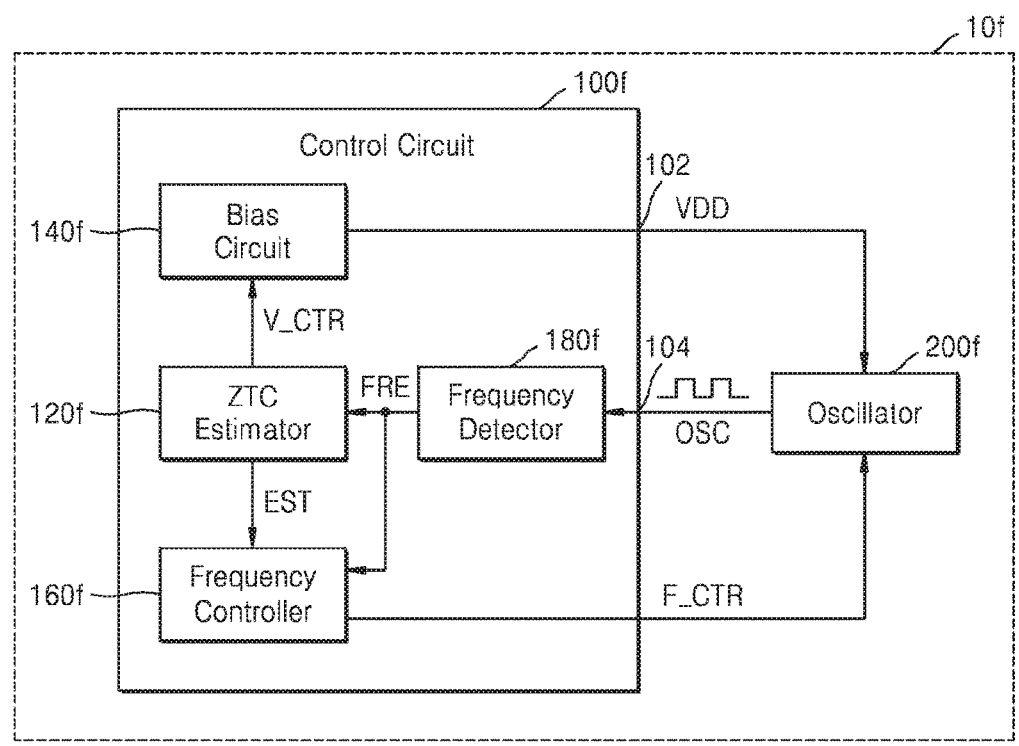

FIGS. 6A and 6B are block diagrams of embodiments of a system. As illustrated in FIGS. 6A and 6B, a control circuit 100e or 100f may include a frequency controller 160e or 160f, and an oscillator 200e or 200f may adjust the frequency of an oscillation signal OSC according to a frequency control signal F_CTR output by frequency controller 160e or 160f. Hereinafter, in the description of FIGS. 6A and 6B, redundant descriptions will be omitted for conciseness.

Similarly to that described above, a ZTC voltage V_ZTC may be calculated by a ZTC estimator 120e or 120f, and the frequency of the oscillation signal OSC may be 'F_ZTC' of FIGS. 3A and 3B when the magnitude of the supply voltage VDD is the ZTC voltage V_ZTC. In order to compensate for the difference between 'F_ZTC' and the frequency desired by the functional blocks operating by receiving the oscillation signal OSC, control circuit 100e or 100f may include frequency controller 160e or 160f as illustrated in FIGS. 6A and 6B.

Referring to FIG. 6A, a system 10e may include a control circuit 100e and an oscillator 200e, and the control circuit 100e may include a ZTC estimator 120e, a bias circuit 140e, and a frequency controller 160e. Frequency controller 160e may receive an estimation signal EST from ZTC estimator 120e, may receive an oscillation signal OSC from oscillator 200e, and in response thereto may generate a frequency control signal F_CTR and provide the same to oscillator 200e.

ZTC estimator 120e may output an activated estimation signal EST which is activated during estimation of the ZTC voltage V_ZTC of oscillator 200e. For example, ZTC estimator 120e may output the bias control signal V_CTR such that the magnitude of the supply voltage VDD becomes each of the first to fourth voltages V1 to V4, may acquire the first to fourth frequencies F1 to F4, may calculate the ZTC voltage V_ZTC, and may output the activated estimation signal EST until the bias control signal V_CTR is output such that the magnitude of the supply voltage VDD becomes the ZTC voltage V_ZTC. The estimation signal EST is deactivated upon completion of the estimation of the ZTC voltage. ZTC estimator 120e may output a deactivated estimation signal EST after outputting the bias control signal V_CTR such that the magnitude of the supply voltage VDD becomes the ZTC voltage V_ZTC.

Frequency controller 160e may receive the estimation signal EST and may not change the frequency control signal F_CTR in response to the activated estimation signal EST. For example, frequency controller 160e may output the frequency control signal F_CTR having a predetermined value (or level) in response to the activated estimation signal EST. That is, since the frequency control signal F_CTR is maintained to be constant while ZTC estimator 120e estimates the ZTC condition of oscillator 200e, the ZTC condition of oscillator 200e may be accurately estimated.

In response to the deactivated estimation signal EST, frequency controller 160e may generate and output the frequency control signal F_CTR such that the frequency of the oscillation signal OSC becomes a predetermined target frequency F_TAR. Frequency controller 160e may receive the predetermined target frequency F_TAR from outside system 10e as illustrated in FIG. 6A, may store the predetermined target frequency F_TAR, or may receive the predetermined target frequency F_TAR from another component (e.g., a functional block receiving the oscillation signal OSC) in system 10e.

Referring to FIG. 6B, a system 10f may include a control circuit 100f and an oscillator 200f, and the control circuit 100f may include a ZTC estimator 120f, a bias circuit 140f, a frequency controller 160f, and a frequency detector 180f. Frequency detector 180f may receive an oscillation signal OSC and may generate and output a frequency detection signal FRE by detecting a frequency of the oscillation signal OSC. Since ZTC estimator 120f and frequency controller 160f may operate based on the frequency of the oscillation signal OSC, they may share a component (i.e., frequency detector 180f) detecting the frequency of the oscillation signal OSC, and thus control circuit 100f may be efficiently designed. For example, frequency detector 180f may include a counter and may detect the frequency of the oscillation signal OSC and generate the frequency detection signal FRE by counting the rising edges (and/or falling edges) of the oscillation signal OSC.

Figure 7:
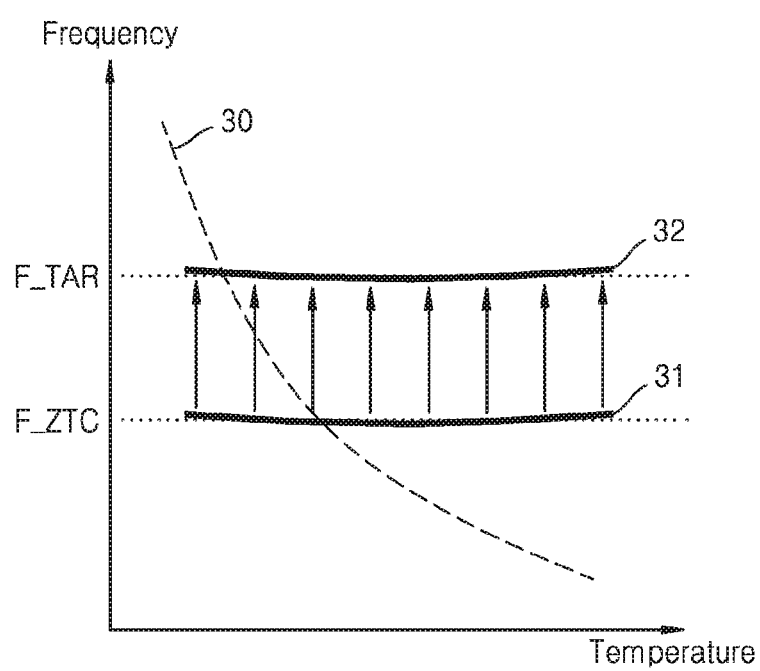
FIG. 7 is a graph illustrating an operation of a frequency controller of FIGS. 6A and 6B.

FIG. 7 is a graph illustrating an operation of frequency controllers 160e and 160f of FIGS. 6A and 6B. As described above with reference to FIGS. 6A and 6B, frequency controller 160e or 160f may adjust the frequency of the oscillation signal OSC in response to the deactivated estimation signal EST after ZTC estimator 120e or 120f completes estimation of the ZTC condition of oscillator 200e or 200f. Hereinafter, FIG. 7 will be described with reference to FIG. 6A.

Referring to FIG. 7, when oscillator 200e is not in the ZTC condition, the frequency of the oscillation signal OSC may decrease with a temperature increase, as indicated by a dotted line 30. However, when oscillator 200e is in the ZTC condition estimated by the ZTC estimator 120e, that is, when the magnitude of the supply voltage VDD is the ZTC voltage V_ZTC, the frequency of the oscillation signal OSC may be maintained at 'F_ZTC' despite a temperature variation, as indicated by a solid line 31. As indicated by a solid line 32, frequency controller 160e may shift the frequency of the oscillation signal OSC from 'F_ZTC' to 'F_TAR' through the frequency control signal F_CTR, and the frequency of the oscillation signal OSC may be maintained at 'F_TAR' despite a temperature variation. That is, since the magnitude of the supply voltage VDD supplied to oscillator 200e may be maintained at the ZTC voltage V_ZTC, the transistors included in oscillator 200e may be in the ZTC condition and thus it may be maintained at 'F_TAR' even when the frequency of the oscillation signal OSC varies according to the frequency control signal F_CTR generated by frequency controller 160e.

Figure 8A:
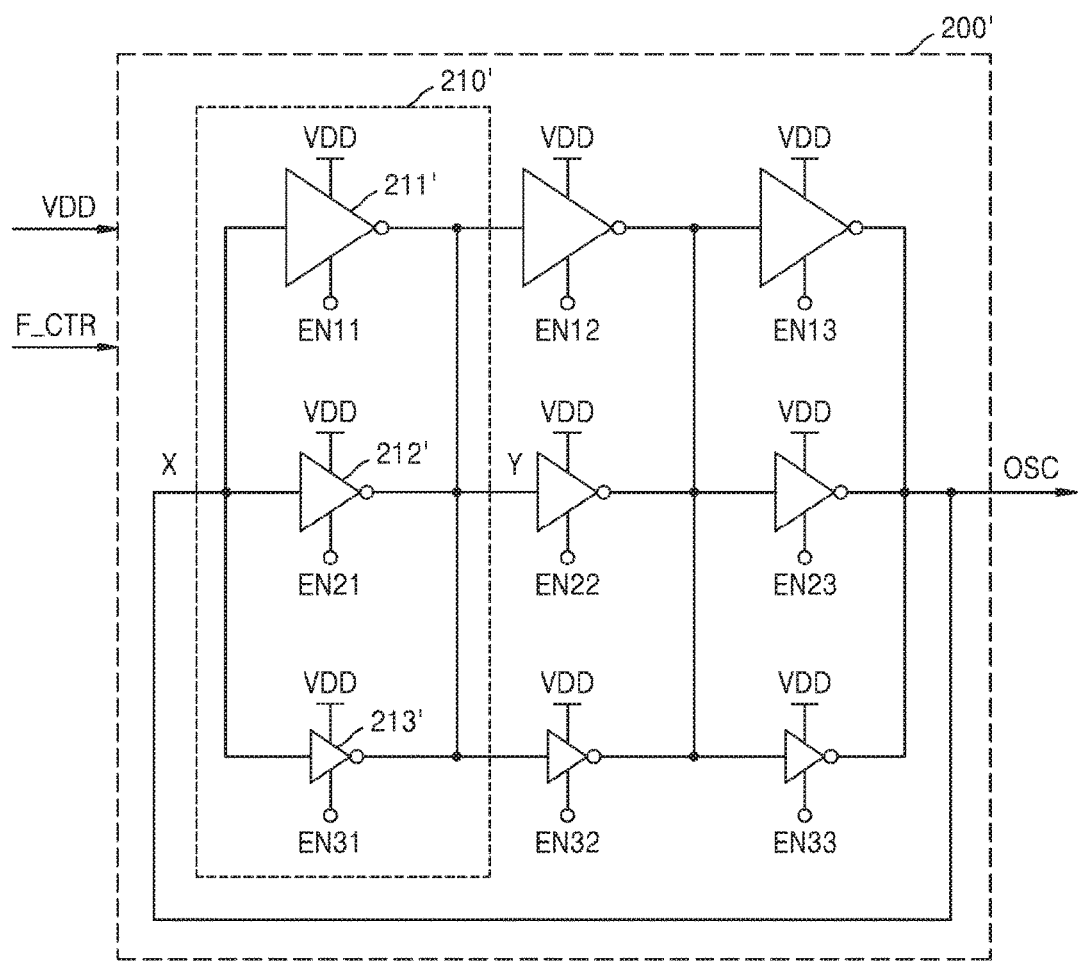
FIG. 8A is a block diagram of an embodiment of an oscillator.
Figure 8B:
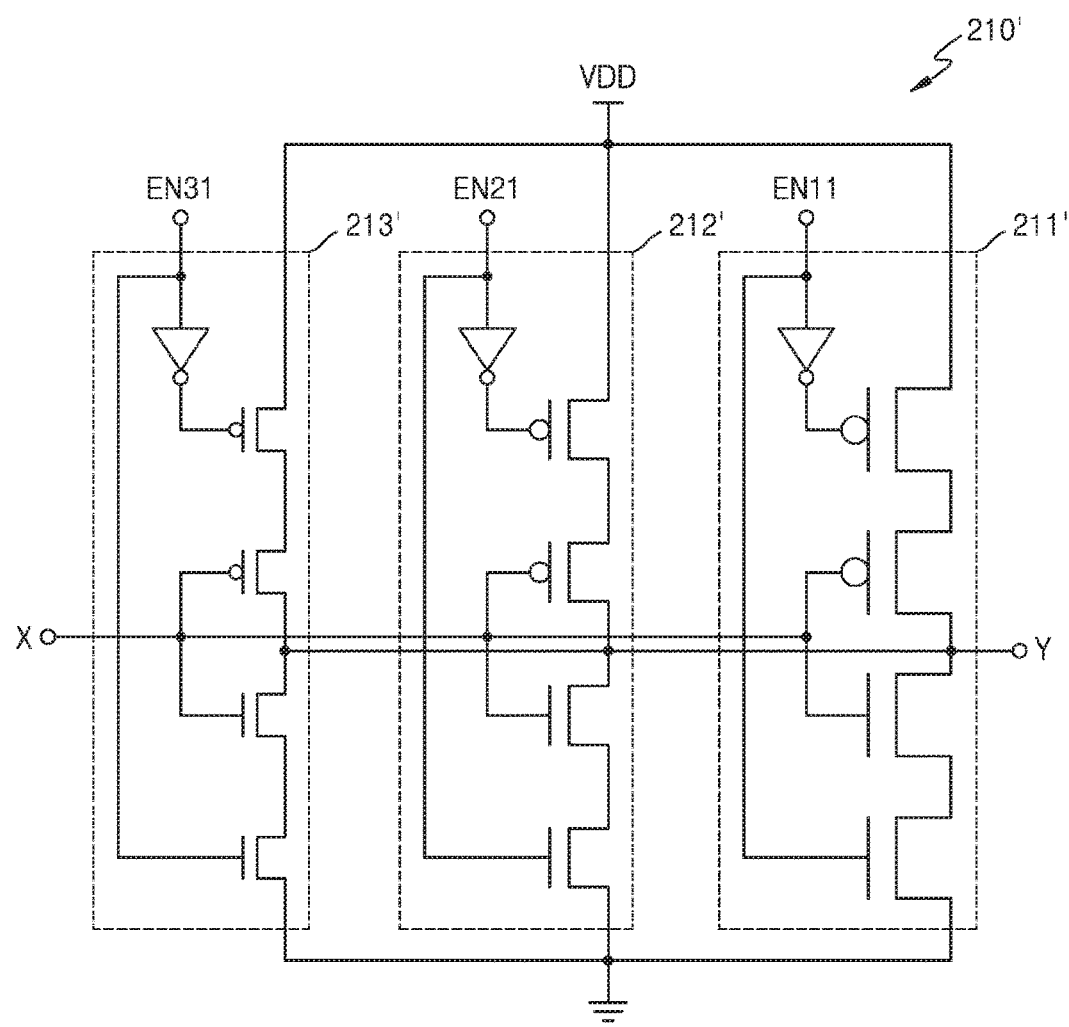
FIG. 8B is a circuit diagram of a portion of the oscillator of FIG. 8A.

FIG. 8A is a block diagram of an embodiment of an oscillator 200', and FIG. 8B is a circuit diagram of a portion of oscillator 200' of FIG. 8A. As described above with reference to FIGS. 6A and 6B, the oscillator 200' may receive the supply voltage VDD, may receive the frequency control signal F_CTR, and may output the oscillation signal OSC.

According to an embodiment, the frequency control signal F_CTR may be a digital signal, and oscillator 200' may be a digitally controlled oscillator (DCO). For example, as illustrated in FIG. 8A, oscillator 200' may be a ring oscillator and may include a plurality of inverters that are connected in series and receive the supply voltage VDD. Also, oscillator 200' may include a plurality of inverters that are connected in parallel with an input and an output connected to each other. Referring to FIG. 8A, oscillator 200' may include three stages each including three inverters connected in parallel. For example, a first stage 210' may include three inverters 211', 212', and 213' connected in parallel to each other. Although FIG. 8A illustrates each stage including three inverters and the oscillator 200' including three stages, it will be understood that the number of inverters included in each stage and the number of stages included in the oscillator may be different from those illustrated in FIG. 8A.

Each of the plurality of inverters may have an enable terminal and may operate, that is, may or may not invert an input signal, according to an enable signal applied to the enable terminal. For example, as described below with reference to FIG. 8B, inverter 211' may output an output signal Y by inverting an input signal X in response to an activated enable signal EN11, and may float a terminal outputting the output signal Y in response to the deactivated enable signal EN11.

As illustrated in FIG. 8A, the plurality of inverters may receive separate enable signals, and each of the enable signals may be activated or deactivated according to the frequency control signal F_CTR. In this manner, the number and type of operating inverters among the plurality of inverters may change according to the frequency control signal F_CTR, and accordingly a signal delay time in each of the stages may change and thus the frequency of the oscillation signal OSC may change. That is, the frequency of the oscillation signal OSC may be digitally controlled by frequency control signal F_CTR.

FIG. 8B is a circuit diagram of first stage 210' of oscillator 200' of FIG. 8A. As illustrated in FIG. 8B, first stage 210' may include inverters 211', 212', and 213', the inputs of inverters 211', 212', and 213' may be connected to each other, and the outputs of inverters 211', 212', and 213' may be connected to each other.

Each of inverters 211', 212', and 213' may include MOS transistors connected in series. That is, each of inverters 211', 212', and 213' may include a PMOS transistor and an NMOS transistor connected in series with each other to invert an input signal, and may include an NMOS transistor having a gate to which an enable signal is applied and a PMOS transistor having a gate to which an inverted enable signal is applied.

As described above with reference to FIG. 8A, inverters 211', 212', and 213' may have different sizes than each other. For example, as illustrated in FIG. 8B, the transistors included in inverter 212' may be larger than the transistors included in inverter 213', and the transistors included in inverter 211' may be larger than the transistors included in inverter 212'. The larger inverter, that is, the inverter including the larger transistors, may have a shorter signal delay time, and thus the respective signal delay times of inverters 211', 212', and 213' may be different from each other. Since first stage 210' includes inverters 211', 212', and 213' of different sizes and inverters 211', 212', and 213' are controlled separately by the enable signals EN11, EN21, and EN31, first stage 210' may have various delay times.

Figure 9:
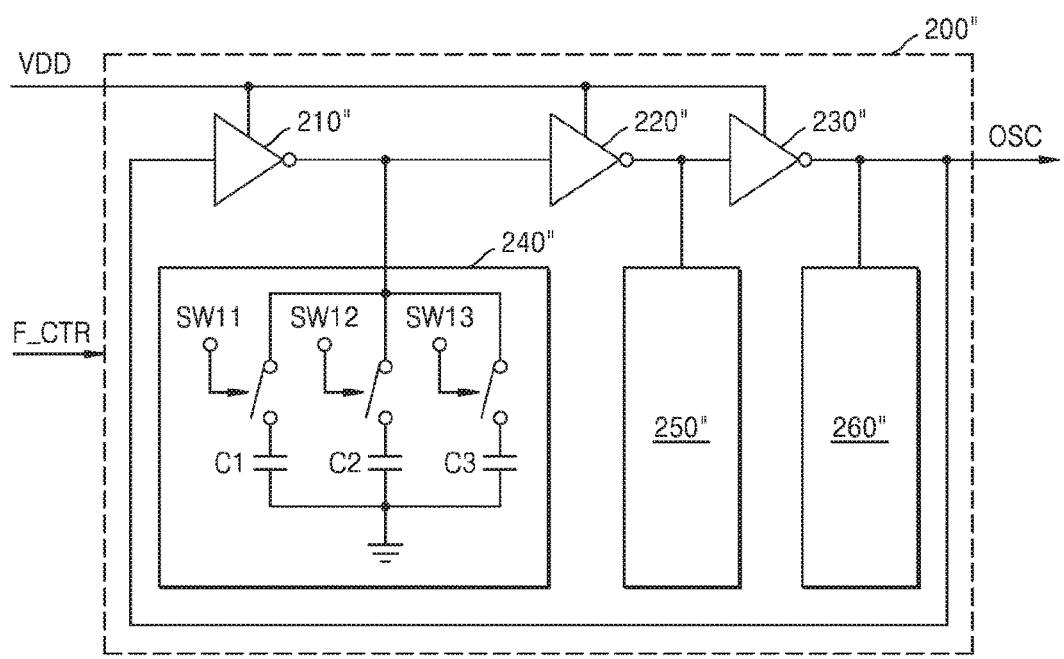
FIG. 9 is a block diagram of an embodiment of an oscillator.

FIG. 9 is a block diagram of an embodiment of an oscillator 200". As illustrated in FIG. 9, oscillator 200" may include inverters 210", 220", and 230" connected in series with each other, and variable capacitance circuits 240", 250", and 260" connected respectively to the outputs of inverters 210", 220", and 230".

Oscillator 200" may adjust the frequency of the oscillation signal OSC by adjusting load capacitance of inverters 210", 220", and 230" based on the frequency control signal F_CTR. That is, as the load capacitance of inverters 210", 220", and 230" increases, a signal delay time may increase and the frequency of the oscillation signal OSC may decrease. Variable capacitance circuits 240", 250", and 260" may be connected respectively to the outputs of inverters 210", 220", and 230" as illustrated in FIG. 9, or variable capacitance circuits 240", 250", and 260" may be connected to only some of the outputs of inverters 210", 220", and 230" unlike the illustration of FIG. 9.

As illustrated in FIG. 9, variable capacitance circuit 240" may include capacitors C1, C2, and C3 and switches that are connected in series respectively to the capacitors C1, C2, and C3 and are controlled respectively by switch control signals SW11, SW12, and SW13. Each of the switch control signals SW11, SW12, and SW13 may be activated or deactivated according to the frequency control signal F_CTR, and the load capacitance of inverter 210" may be determined by the switch control signals SW11, SW12, and SW13. Also, the capacitances of the capacitors C1, C2, and C3 included in the variable capacitance circuit 240" may be different from each other. In an embodiment, capacitors C1, C2, and C3 included in variable capacitance circuit 240" may be, for example, metal capacitors having low temperature coefficients.

Figure 10:
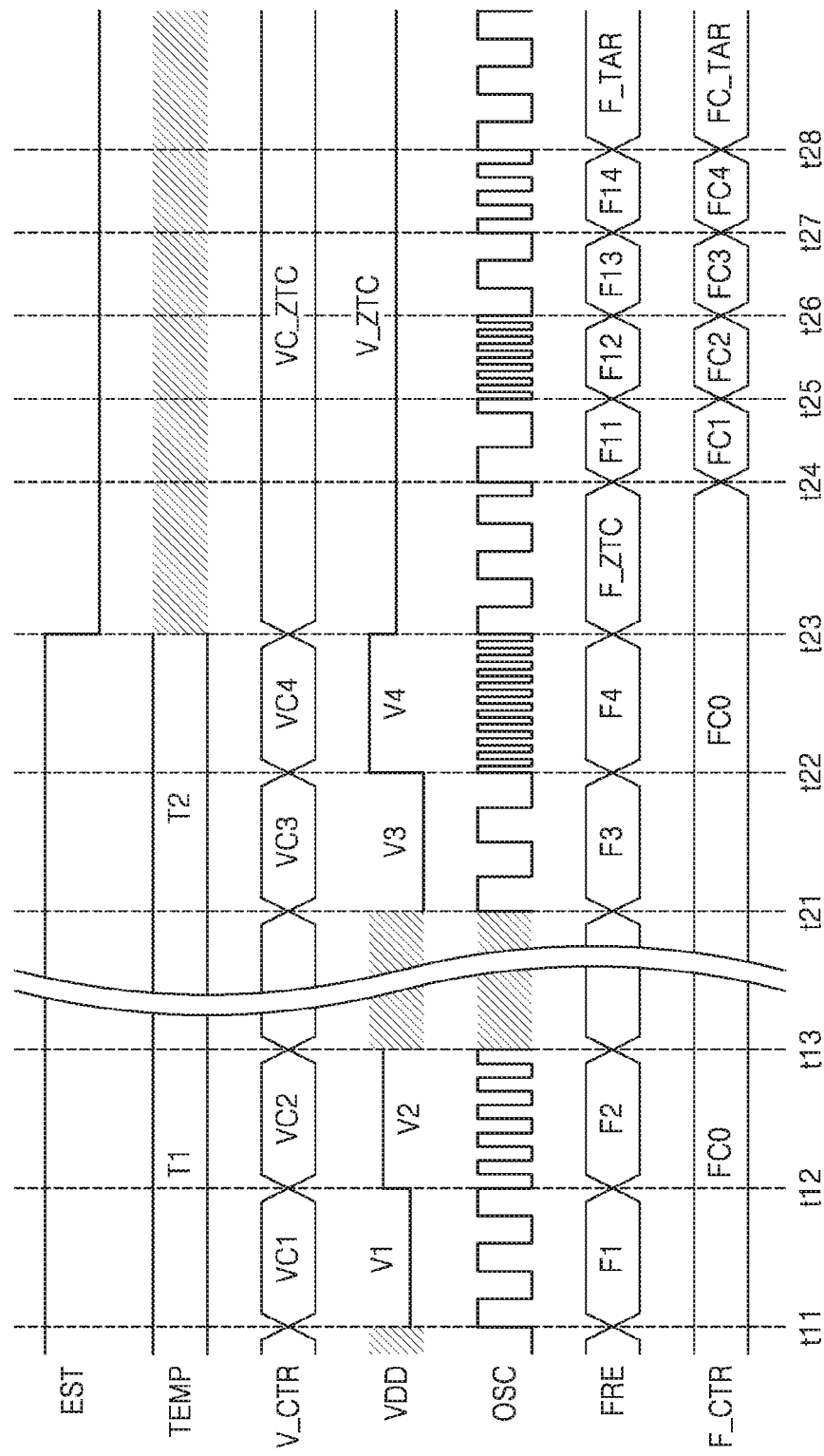
FIG. 10 is a timing diagram of examples of signals of the system of FIG. 6B.

FIG. 10 is a timing diagram of examples of signals of the system of FIG. 6B. As described above, the ZTC voltage V_ZTC of oscillator 200f may be determined through a digital operation, and the frequency of the oscillation signal OSC output by oscillator 200f may be digitally controlled. Although FIG. 6B does not illustrate the temperature signal TEMP, it is assumed in the description of FIG. 10 that ZTC estimator 120f of FIG. 6B receives the temperature signal TEMP representing the temperature of oscillator 200f. Hereinafter, FIG. 10 will be described with reference to FIG. 6B.

At times t11 to t23, ZTC estimator 120f may perform an operation for estimating the ZTC condition of oscillator 200f and may output the activated estimation signal EST. That is, ZTC estimator 120f may maintain the activated estimation signal EST from the time of starting until the time (e.g., the time t23) of completing the estimation of the ZTC condition of oscillator 200f. In response to the activated estimation signal EST, frequency controller 160f may maintain the value of the frequency control signal F_CTR at 'FC0'.

At the time t11, the temperature signal TEMP may represent the first temperature T1 due to oscillator 200f having the first temperature T1. ZTC estimator 120f may recognize the first temperature T1 through the temperature signal TEMP and may output the bias control signal V_CTR of 'VC1' such that the magnitude of the supply voltage VDD becomes the first voltage V1. Bias circuit 140f may output the supply voltage VDD having the magnitude of the first voltage V1 in response to the bias control signal V_CTR of 'VC1'. Due to the supply voltage VDD having the magnitude of the first voltage V1 and the frequency control signal F_CTR of 'FC0', oscillator 200f may output the oscillation signal OSC having the first frequency F1. Frequency detector 180f may output the frequency detection signal FRE representing the first frequency F1 by detecting the frequency of the oscillation signal OSC. ZTC estimator 120f may store the first frequency F1 (e.g., in first storage device 121a of FIG. 4A) according to the frequency detection signal FRE received from frequency detector 180f.

At the time t12, ZTC estimator 120f may output the bias control signal V_CTR of 'VC2' such that the magnitude of the supply voltage VDD becomes the second voltage V2. Bias circuit 140f may output the supply voltage VDD having the magnitude of the second voltage V2 in response to the bias control signal V_CTR of 'VC2'. Due to the supply voltage VDD having the magnitude of the second voltage V2 and the frequency control signal F_CTR of 'FC0', oscillator 200f may output the oscillation signal OSC having the second frequency F2. Frequency detector 180f may output the frequency detection signal FRE representing the second frequency F2 by detecting the frequency of the oscillation signal OSC. ZTC estimator 120f may store the second frequency F2 (e.g., in second storage device 122a of FIG. 4A) according to the frequency detection signal FRE received from frequency detector 180f.

At the time t21, the temperature signal TEMP may represent the second temperature T2 due to oscillator 200f having the second temperature T2. ZTC estimator 120f may recognize the second temperature T2 through the temperature signal TEMP and may output the bias control signal V_CTR of 'VC3' such that the magnitude of the supply voltage VDD becomes the third voltage V3. Bias circuit 140f may output the supply voltage VDD having the magnitude of the third voltage V3 in response to the bias control signal V_CTR of 'VC3'. Due to the supply voltage VDD having the magnitude of the third voltage V3 and the frequency control signal F_CTR of 'FC0', oscillator 200*f* may output the oscillation signal OSC having the third frequency F3. Frequency detector 180*f* may output the frequency detection signal FRE representing the third frequency F3 by detecting the frequency of the oscillation signal OSC. ZTC estimator 120*f* may store the third frequency F3 (e.g., in third storage device 123*a* of FIG. 4A) according to the frequency detection signal FRE received from frequency detector 180*f*.

At the time t22, ZTC estimator 120*f* may output the bias control signal V_CTR of 'VC4' such that the magnitude of the supply voltage VDD becomes the fourth voltage V4. Bias circuit 140*f* may output the supply voltage VDD having the magnitude of the fourth voltage V4 in response to the bias control signal V_CTR of 'VC4'. Due to the supply voltage VDD having the magnitude of the fourth voltage V4 and the frequency control signal F_CTR of 'FC0', oscillator 200*f* may output the oscillation signal OSC having the fourth frequency F4. Frequency detector 180*f* may output the frequency detection signal FRE representing the fourth frequency F4 by detecting the frequency of the oscillation signal OSC. ZTC estimator 120*f* may store the fourth frequency F4 (e.g., in fourth storage device 124*a* of FIG. 4A) according to the frequency detection signal FRE received from frequency detector 180*f*.

At the time t23, ZTC estimator 120*f* may calculate the ZTC voltage V_ZTC based on the first to fourth voltages V1 to V4 and the first to fourth frequencies F1 to F4, and may output the bias control signal V_CTR of 'VC_ZTC' such that the magnitude of the supply voltage VDD becomes the ZTC voltage V_ZTC. Also, ZTC estimator 120*f* may output the deactivated estimation signal EST since estimation of the ZTC condition of oscillator 200*e* is completed. Bias circuit 140*f* may output the supply voltage VDD having the magnitude of the ZTC voltage V_ZTC in response to the bias control signal V_CTR of 'VC_ZTC'. Due to the supply voltage VDD having the magnitude of the ZTC voltage V_ZTC and the frequency control signal F_CTR of 'FC0', oscillator 200*f* may output the oscillation signal OSC having a frequency of 'F_ZTC'. Frequency detector 180*f* may output the frequency detection signal FRE representing 'F_ZTC' by detecting the frequency of the oscillation signal OSC. ZTC estimator 120*f* may maintain the bias control signal V_CTR at 'VC_ZTC' such that the magnitude of the supply voltage VDD is maintained at the ZTC voltage V_ZTC.

At the time t24, frequency controller 160*f* may start an operation for changing the frequency 'F_ZTC' of the oscillation signal OSC to the predetermined target frequency F_TAR. That is, frequency controller 160*f* may output the frequency control signal F_CTR of 'FC1' in response to the deactivated estimation signal EST, and may output the oscillation signal OSC having a frequency of 'F11' due to the supply voltage VDD having the magnitude of the ZTC voltage V_ZTC and the frequency control signal F_CTR of 'FC1'. Frequency detector 180*f* may output the frequency detection signal FRE representing 'F11' by detecting the frequency of the oscillation signal OSC. Frequency controller 160*f* may recognize the frequency 'F11' due to the frequency detection signal FRE received from frequency detector 180*f* and may determine the next value (i.e., 'FC2') of the frequency control signal F_CTR by comparing it with the predetermined target frequency F_TAR. Similarly, at each of the times t25, t26, and t27, based on the frequency detection signal FRE received from frequency detector 180*f*, frequency controller 160*f* may adjust the value of the frequency control signal F_CTR such that the frequency of the oscillation signal OSC becomes the predetermined target frequency F_TAR.

At the time t28, frequency controller 160*f* may output the frequency control signal F_CTR of 'FC_TAR', and oscillator 200*f* may output the oscillation signal OSC having the predetermined target frequency F_TAR due to the supply voltage VDD having the magnitude of the ZTC voltage V_ZTC and the frequency control signal F_CTR of 'FC_TAR'. By detecting the frequency of the oscillation signal OSC, frequency detector 180*f* may recognize the predetermined target frequency F_TAR and may maintain the frequency control signal F_CTR at 'FC_TAR'.

Figure 11A:
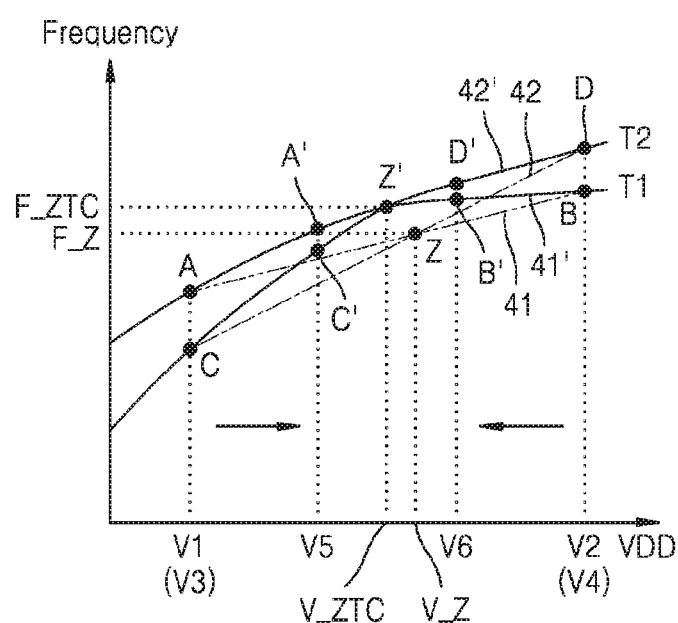
FIGS. 11A and 11B are graphs and tables illustrating an operation of an embodiment of the ZTC estimator of FIG. 1.
Figure 11B:
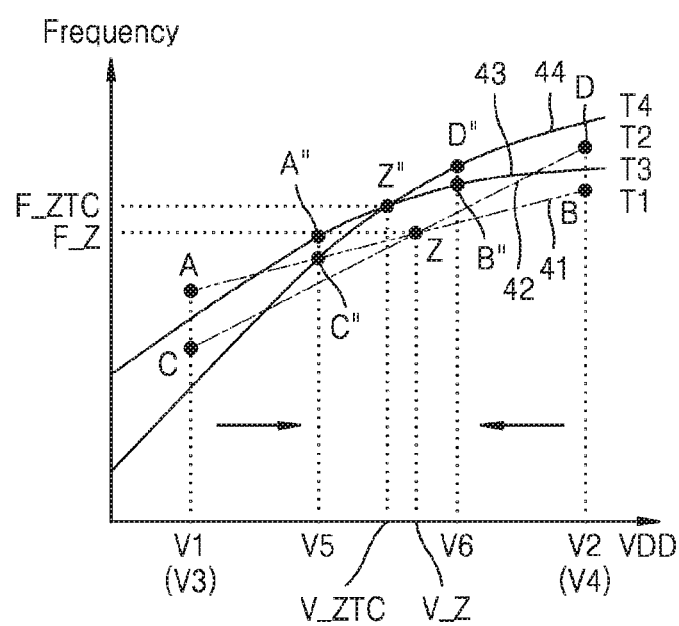

FIGS. 11A and 11B are graphs and tables illustrating an operation of an embodiment of ZTC estimator 120 of FIG. 1. Similarly to FIGS. 3A and 3B described above, ZTC estimator 120 may calculate a ZTC voltage V_ZTC from a cross point Z between a first line 41 and a second line 42. As described below with reference to FIGS. 11A and 11B, based on the cross point, or intersection point, Z derived from the first and second lines 41 and 42, ZTC estimator 120 may additionally perform an operation of compensating for the nonlinear characteristic of oscillator 200. As in FIG. 3B, in FIGS. 11A and 11B, the first and third voltages V1 and V3 may be equal to each other, and the second and fourth voltages V2 and V4 may be equal to each other.

Referring to FIG. 11A, the cross point Z may be calculated from a straight line connecting points A and B and a straight line connecting points C and D (i.e., lines 41 and 42), and the frequency characteristic of the oscillation signal OSC depending on the supply voltage VDD of oscillator 200 may be nonlinear as illustrated FIG. 11A. Accordingly, the cross point Z calculated from the four detected points A, B, C, and D may be different from the ZTC point, that is, a cross point between a characteristic curve 41' of the first temperature T1 and a characteristic curve 42' of the second temperature T2.

As the distance between the four detected points A, B, C, and D decreases, that is, as the difference between the first and second voltages V1 and V2 decreases, the difference between the cross point Z and the actual ZTC point may decrease. As described below, ZTC estimator 120 may detect four new points A', B', C', and D' based on the cross point Z calculated from the four detected points A, B, C, and D, and may calculate a cross point Z', which is substantially identical to the actual ZTC point or has a reduced error with respect to the actual ZTC point, from the four new points A', B', C', and D'.

According to an embodiment, ZTC estimator 120 may detect the four points A, B, C, and D at the first and second temperatures T1 and T2 by using the first and second voltages V1 and V2, and may calculate the cross point Z from the four detected points A, B, C, and D. Thereafter, ZTC estimator 120 may calculate a fifth voltage V5 between the first voltage V1 and a voltage V_Z corresponding to the cross point Z, and a sixth voltage V6 between the second voltage V2 and the voltage V_Z corresponding to the cross point Z. ZTC estimator 120 may detect fifth to eighth frequencies F5 to F8 at the first and second temperatures T1 and T2 by using the fifth and sixth voltages V5 and V6, and may calculate the cross point Z' from the four detected points A', B', C', and D'. As illustrated in FIG. 11A, the four detected points A', B', C', and D' may have the smaller distances therebetween than the previous four points A, B, C, and D, and thus the cross point Z' may be closer to the ZTC point than the cross point Z. Accordingly, ZTC estimator 120 may determine the voltage corresponding to the cross point Z' as the ZTC voltage V_ZTC.

Referring to FIG. 11B, ZTC estimator 120 may detect four new points A", B", C", and D" at temperatures different from those for detecting the four points A, B, C, and D. That is, as illustrated in FIG. 11B, ZTC estimator 120 may detect the four points A, B, C, and D at each of the first and second temperatures T1 and T2 by using the first and second voltages V1 and V2, may calculate the cross point Z from the four detected points A, B, C, and D, and may calculate the fifth and sixth voltages V5 and V6 based on the voltage V_Z corresponding to the cross point Z. Thereafter, ZTC estimator 120 may detect four frequencies of the oscillation signal corresponding to four combinations of the third and fourth temperatures and the fifth and sixth voltages. In particular, ZTC estimator 120 may detect the fifth to eighth frequencies F5 to F8 at third and fourth temperatures T3 and T4 different from the first and second temperatures T1 and T2 by using the fifth and sixth voltages V5 and V6, and may calculate a cross point Z" from the four detected points A", B", C", and D". As described above with reference to FIGS. 2, 3A, and 3B, in oscillator 200, since the supply voltage VDD and the frequency of the oscillation signal OSC are constant at the ZTC point regardless of the temperature, the cross point Z" calculated from the four points A", B", C", and D" detected the third and fourth temperatures T3 and T4 may also be effective. That is, not only a characteristic curve 43 of the third temperature T3 and a characteristic curve 44 of the fourth temperature T4 in FIG. 11B but also the characteristic curve 41' of the first temperature T1 and the characteristic curve 42' of the second temperature T2 in FIG. 11A may cross at the ZTC point.

Figure 12:
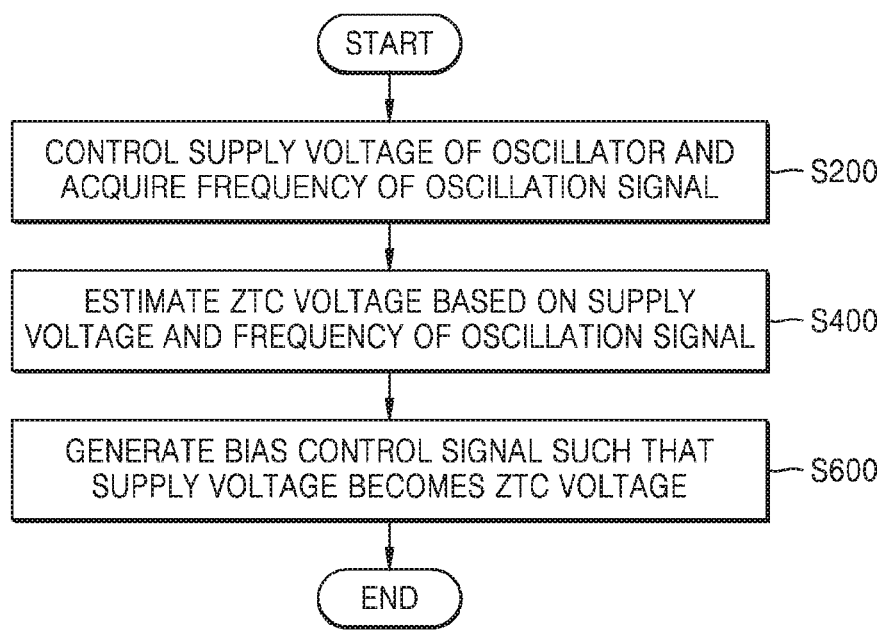
FIG. 12 is a flowchart illustrating an embodiment of a method of controlling an oscillator.

FIG. 12 is a flowchart illustrating an embodiment of a method of controlling an oscillator. As illustrated in FIG. 12, the method may include a plurality of operations S200, S400, and S600 and may be performed, for example, by ZTC estimator 120 of FIG. 1. Hereinafter, FIG. 12 will be described with reference to FIG. 1.

In operation S200, the supply voltage VDD of oscillator 200 may be controlled and the frequency of the oscillation signal OSC may be acquired. The frequency of the oscillation signal OSC output by oscillator 200 may vary according to the magnitude of the supply voltage VDD supplied to oscillator 200, and ZTC estimator 120 may supply the supply voltage VDD of various magnitudes to oscillator 200 and acquire the resulting frequencies of the oscillation signal OSC. Details of operation S200 will be described below with reference to FIG. 13.

In operation S400, the ZTC voltage V_ZTC may be estimated based on the supply voltage VDD and the frequency of the oscillation signal OSC. For example, in the graph with two axes respectively representing the magnitude of the supply voltage of oscillator 200 and the frequency of the oscillation signal OSC, ZTC estimator 120 may derive a line from the first and second frequencies F1 and F2 corresponding to the different first and second voltages V1 and V2 and may estimate the ZTC voltage V_ZTC from the cross point between the lines derived respectively at the different temperatures of oscillator 200.

In operation S600, the bias control signal V_CTR may be generated such that the magnitude of the supply voltage VDD becomes the ZTC voltage V_ZTC. Bias circuit 140 supplying the supply voltage VDD to oscillator 200 may adjust the magnitude of the supply voltage VDD based on the bias control signal V_CTR, and ZTC estimator 120 may generate the bias control signal V_CTR such that the magnitude of the supply voltage VDD becomes the ZTC voltage V_ZTC, and provide the same to bias circuit 140. Accordingly, the supply voltage VDD having the magnitude of the ZTC voltage V_ZTC may be supplied to oscillator 200, and oscillator 200 may output the oscillation signal OSC of a constant frequency regardless of a temperature variation in the ZTC condition.

Figure 13:
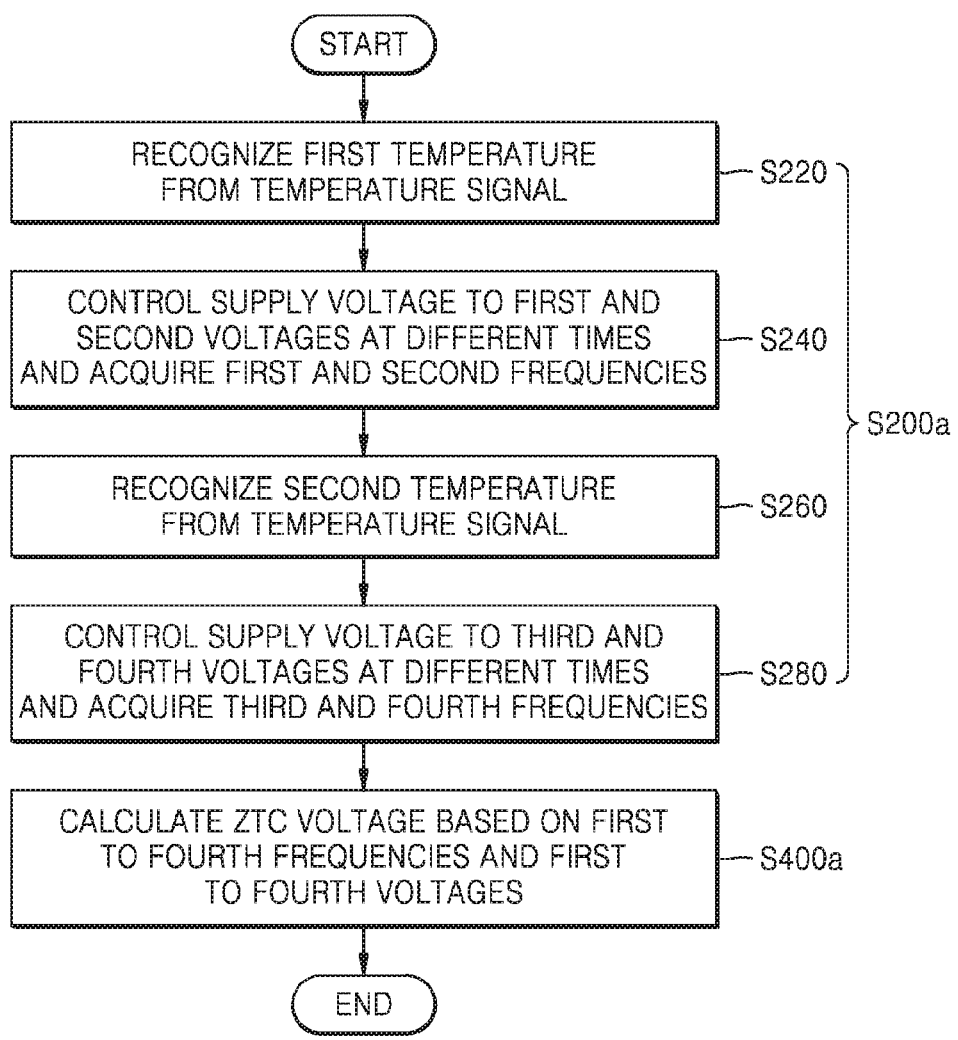
FIG. 13 is a flowchart illustrating an example of embodiments of operations S200 and S400 of FIG. 12.

FIG. 13 is a flowchart illustrating an example of embodiments of operations S200 and S400 of FIG. 12. In the manner described above with reference to FIG. 12, in operation S200a, the magnitude of the supply voltage of the oscillator may be controlled and the frequency of the oscillation signal may be acquired; and in operation S400a, the ZTC voltage V_ZTC may be estimated based on the magnitude of the supply voltage and the frequency of the oscillation signal. According to an embodiment, operations S200a and S400a of FIG. 13 may be performed by ZTC estimator 120c or 120d respectively of FIGS. 5A and 5B. Hereinafter, FIG. 13 will be described with reference to FIGS. 3A and 5A.

Referring to FIG. 13, operation S200a may include operations S220, S240, S260, and S280. In operation S220, the first temperature T1 may be recognized from the temperature signal TEMP. ZTC estimator 120c may recognize the first temperature T1 of the oscillator 200c from the temperature signal TEMP received from outside the system 10c (or generated in the system 10d as illustrated in FIG. 5B).

In operation S240, the magnitude of the supply voltage VDD may be controlled to become the first and second voltages V1 and V2 at different times and the first and second frequencies F1 and F2 may be acquired. For example, ZTC estimator 120c may generate the bias control signal V_CTR such that the magnitude of the supply voltage VDD becomes the first voltage V1, and may acquire the first frequency F1 of the oscillation signal OSC. Thereafter, ZTC estimator 120c may generate the bias control signal V_CTR such that the magnitude of the supply voltage VDD becomes the second voltage V2, and may acquire the second frequency F2 of the oscillation signal OSC.

In operation S260, the second temperature T2 may be recognized from the temperature signal TEMP. The second temperature T2 may be different from the first temperature T1, and the difference between the first and second temperatures T1 and T2 may be greater than a predetermined value, as described below with reference to FIG. 14. By recognizing the second temperature T2, ZTC estimator 120c may start an operation for deriving a feature different from the frequency feature (e.g., the first line 21 of FIG. 3A) of the oscillation signal OSC according to the magnitude of the supply voltage VDD of oscillator 200c derived at the first temperature T1.

In operation S280, the magnitude of the supply voltage VDD may be controlled to become the third and fourth voltages V3 and V4 at different times and the third and fourth frequencies F3 and F4 may be acquired. For example, ZTC estimator 120c may generate the bias control signal V_CTR such that the magnitude of the supply voltage VDD becomes the third voltage V3, and may acquire the third frequency F3 of the oscillation signal OSC. Thereafter, ZTC estimator 120c may generate the bias control signal V_CTR such that the magnitude of the supply voltage VDD becomes the fourth voltage V4, and may acquire the fourth frequency F4 of the oscillation signal OSC. In an embodiment, the first and third voltages V1 and V3 may be equal to each other and the second and fourth voltages V2 and V4 may be equal to each other.

In operation S400a, the ZTC voltage V_ZTC may be calculated based on the first to fourth frequencies F1 to F4 and the first to fourth voltages V1 to V4. For example, as illustrated in FIG. 3A, ZTC estimator 120c may derive the first and second lines 21 and 22 from the first to fourth frequencies F1 to F4 and the first to fourth voltages V1 to V4, and may calculate the cross point Z between the first and second lines 21 and 22 as the ZTC point. The ZTC voltage V_ZTC may be a voltage corresponding to the cross point Z.

Figure 14:
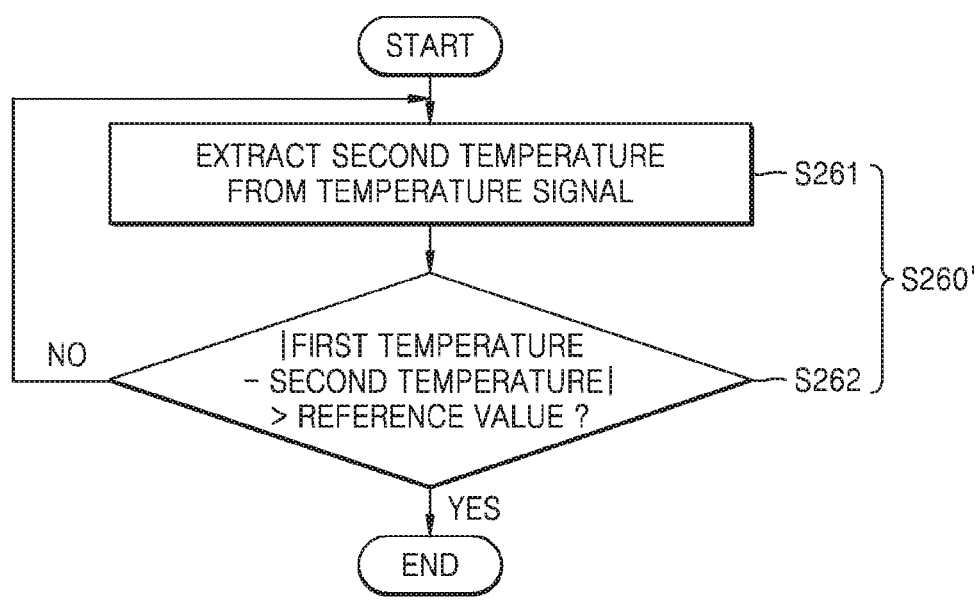
FIG. 14 is a flowchart illustrating an example embodiment of operation S260 of FIG. 13.

FIG. 14 is a flowchart illustrating an example embodiment S260' of operation S260 of FIG. 13. In the manner described above with reference to FIG. 13, in operation S260', the second temperature T2 may be recognized from the temperature signal TEMP. Referring to FIG. 14, operation S260' may include operations S261 and S262. Hereinafter, FIG. 14 will be described with reference to FIG. 5A.

In operation S261, the second temperature T2 may be extracted from the temperature signal TEMP. As described above with reference to FIGS. 5A and 5B, the temperature signal TEMP may be a signal capable of representing various temperatures of oscillator 200c. For example, the temperature signal TEMP may include a plurality of bits and may be received by ZTC estimator 120c in parallel through a plurality of signal lines, or may be received by ZTC estimator 120c in series through one signal line. ZTC estimator 120c may extract the second temperature T2 represented by the temperature signal TEMP from the temperature signal TEMP.

In operation S262, the difference between the first temperature T1 and the second temperature T2 may be compared with a reference value. Referring to FIG. 3A, when the difference between the first and second temperatures T1 and T2 is small, the slope difference between the derived first and second lines 21 and 22 may be small. On the other hand, when the difference between the first and second temperatures T1 and T2 is sufficiently large, the slope difference between the derived first and second lines 21 and 22 may be large and thus the cross point Z between the first and second lines 21 and 22 may be closer to the ZTC point. Thus, by comparing the difference between the first and second temperatures T1 and T2 with a reference value, when the difference between the first and second temperatures T1 and T2 is smaller than the reference value, ZTC estimator 120c may again extract the second temperature T2 from a new temperature signal TEMP in operation S261. On the other hand, when the difference between the first and second temperatures T1 and T2 is greater than the reference value, subsequent operations (e.g., operation S280 of FIG. 13) may be performed at the extracted second temperature T2.

Figure 15:
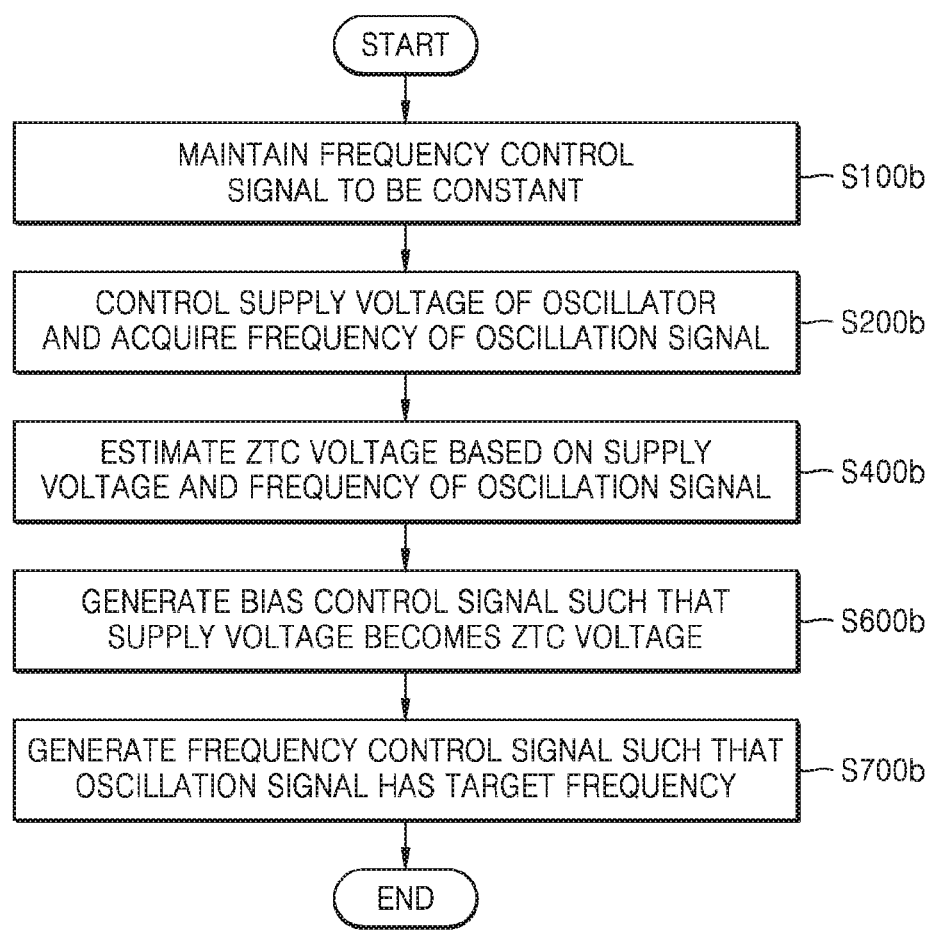
FIG. 15 is a flowchart illustrating an embodiment of a method of controlling an oscillator.

FIG. 15 is a flowchart illustrating an embodiment of a method of controlling an oscillator. As illustrated in FIG. 15, the method may include a plurality of operations S100b, S200b, S400b, S600b, and S700b and may be performed, for example, by control circuit 100e or 100f respectively of FIGS. 6A and 6B. Hereinafter, FIG. 15 will be described with reference to FIG. 6A.

In operation S100b, the frequency control signal F_CTR may be maintained to be constant. For example, frequency controller 160e may maintain the frequency control signal F_CTR to be constant in response to the activated estimation signal EST output from ZTC estimator 120e. That is, in the subsequent operations, since the frequency control signal F_CTR may be maintained to be constant while the ZTC condition of oscillator 200e is estimated, the frequency characteristic of the oscillation signal OSC according to the magnitude of the supply voltage VDD of oscillator 200e may be detected and thus the ZTC condition of oscillator 200e may be accurately estimated.

Operations S200b, S400b, and S600b of FIG. 15 may be identical or similar to operations S200, S400, and S600 of FIG. 12, respectively. That is, ZTC estimator 120e may acquire a plurality of frequencies of the oscillation signal OSC by controlling the magnitude of the supply voltage VDD and may estimate the ZTC voltage V_ZTC of oscillator 200e based on the magnitude of the supply voltage VDD and the plurality of frequencies. Also, ZTC estimator 120e may generate and output the bias control signal V_CTR such that the magnitude of the supply voltage VDD becomes the ZTC voltage V_ZTC.

In operation S700b, the frequency control signal F_CTR may be generated such that the oscillation signal OSC has the predetermined target frequency F_TAR. For example, as illustrated in FIG. 7, when the magnitude of the supply voltage VDD is the ZTC voltage V_ZTC and the frequency control signal F_CTR is the value set in operation S100b, the frequency F_ZTC of the oscillation signal OSC may be different from the predetermined target frequency F_TAR. Accordingly, frequency controller 160e may generate the frequency control signal F_CTR, provide the same to oscillator 200e, and acquire the corresponding frequency of the oscillation signal OSC to generate the frequency control signal F_CTR such that the oscillation signal OSC has the predetermined target frequency F_TAR. Accordingly, oscillator 200e may output the oscillation signal OSC having the predetermined target frequency F_TAR regardless of a process-voltage-temperature (PVT) variation.

Figure 16:
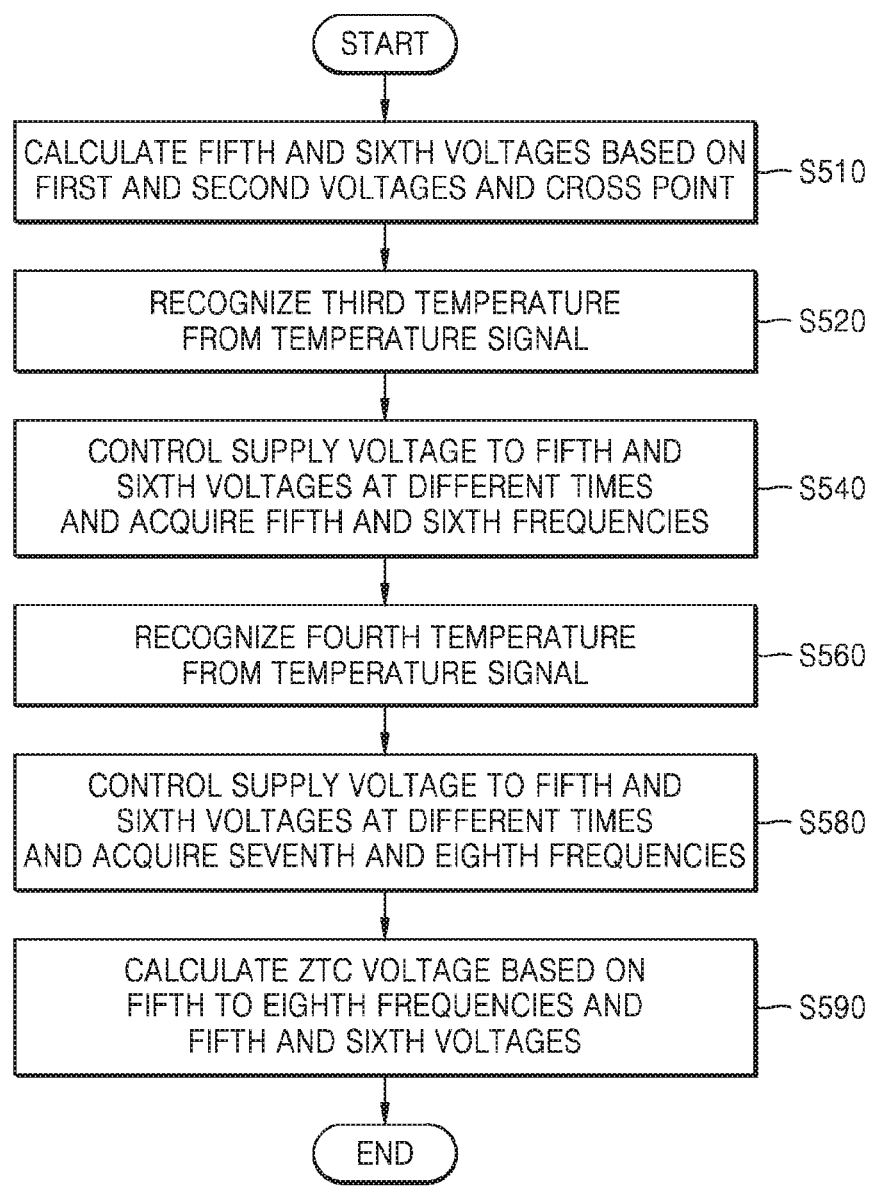
FIG. 16 is a flowchart illustrating an embodiment of a method of controlling an oscillator.

FIG. 16 is a flowchart illustrating an embodiment of a method of controlling an oscillator. As described above with reference to FIGS. 11A and 11B, the nonlinear characteristic of the oscillator may be compensated for. For example, operations S510, S520, S540, S560, S580, and S590 of FIG. 16 may be performed after operation S400a of FIG. 13 and may be performed by control circuit 100e or 100f respectively of FIGS. 6A and 6B. Hereinafter, FIG. 16 will be described with reference to FIGS. 11B and 6A.

In operation S510, the fifth and sixth voltages V5 and V6 may be calculated based on the cross point Z and the first and second voltages V1 and V2. The cross point Z may be calculated from the first to fourth voltages V1 to V4 and the first to fourth frequencies F1 to F4 in the previous operation. In the example of FIG. 16, the first and third voltages V1 and V3 may be equal to each other and the second and fourth voltages V2 and V4 may be equal to each other. The fifth voltage V5 may be between the first voltage V1 and the voltage V_Z corresponding to the cross point Z, and the sixth voltage V6 may be between the second voltage V2 and the voltage V_Z corresponding to the cross point Z.

Operations S520, S540, S560, and S580 of FIG. 16 may be performed in the manner of operations S220, S240, S260, and S280 of FIG. 13. That is, the fifth and sixth frequencies F5 and F6 corresponding respectively to the fifth and sixth voltages V5 and V6 may be acquired at the third temperature T3, and the seventh and eighth frequencies F7 and F8 corresponding respectively to the fifth and sixth voltages V5 and V6 may be acquired at the fourth temperature T4. In an embodiment, the third temperature T3 may be equal to the first temperature T1 of FIG. 13, and the fourth temperature T4 may be equal to the second temperature T2 of FIG. 13.

In operation S590, the ZTC voltage V_ZTC may be calculated based on the fifth to eighth frequencies F5 to F8 and the fifth and sixth voltages V5 and V6. For example, a line of the third temperature T3 formed by the fifth and sixth frequencies F5 and F6 and the fifth and sixth voltages V5 and V6 may be extracted, and a line of the fourth temperature T4 formed by the seventh and eighth frequencies F7 and F8 and the fifth and sixth voltages V5 and V6 may be extracted. The cross point Z" between the line of the third temperature T3 and the line of the fourth temperature T4 may be calculated, and the cross point Z" may be closer to the ZTC point than the cross point Z of operation S510. Accordingly, the voltage corresponding to the cross point Z" may be determined as the ZTC voltage V_ZTC.

Figure 17:
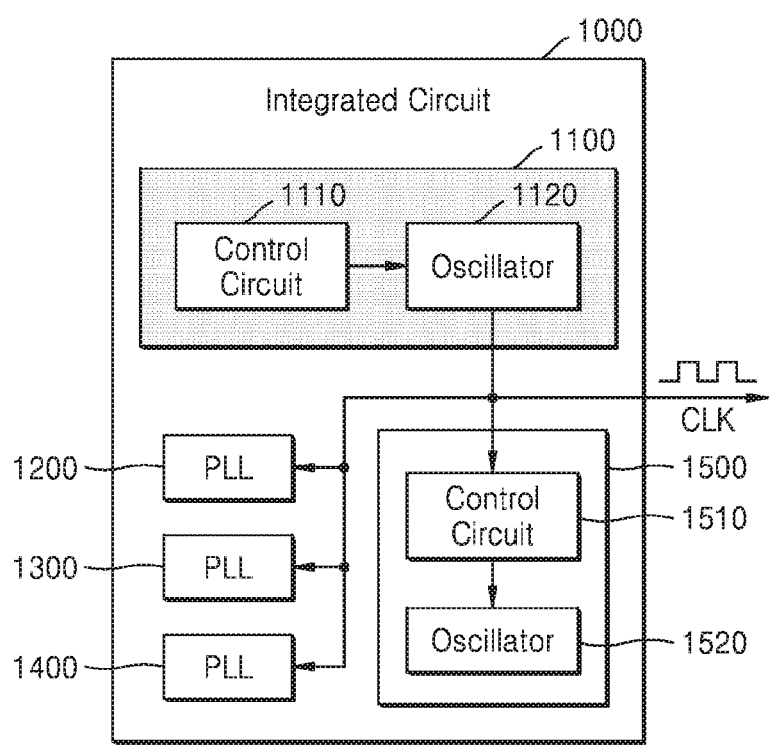
FIG. 17 is a block diagram of an embodiment of an integrated circuit including an oscillator control circuit.

FIG. 17 is a block diagram of an embodiment of an integrated circuit 1000 including an oscillator control circuit 1110. As illustrated in FIG. 17, integrated circuit 1000 may include a reference clock generator 1100, a plurality of phase locked loops (PLLs) 1200, 1300, and 1400, and a clock signal generator 1500.

Reference clock generator 1100 may include an oscillator control circuit 1110 and an oscillator 1120 according to an embodiment. Similar to what has been described above, oscillator control circuit 1110 according to an embodiment may control the magnitude of a supply voltage of oscillator 1120 to estimate a ZTC condition of oscillator 1120, and may control oscillator 1120 such that an output signal of oscillator 1120 has a predetermined target frequency. Accordingly, the output signal of oscillator 1120 may have a constant frequency (i.e., the predetermined target frequency) regardless of a PVT variation, and may be used as a reference clock signal CLK.

As illustrated in FIG. 17, the reference clock signal CLK may be supplied to the plurality of PLLs 1200, 1300, and 1400 and may also be supplied to clock signal generator 1500 including an oscillator control circuit 1510 and an oscillator 1520 according to an embodiment. For example, oscillator control circuit 1510 may include a frequency detector for detecting the frequency of an output signal of oscillator 1520, and a counter included in the frequency detector may detect the frequency of the output signal of oscillator 1520 based on a count value of edges of the reference clock signal CLK and a count value of edges of the output signal of oscillator 1520. Also, as illustrated in FIG. 17, the reference clock signal CLK generated by reference clock generator 1100 may be output to the outside of integrated circuit 1000. Accordingly, since a crystal oscillator may be replaced by reference clock generator 1100, space may be saved.

Embodiments of the inventive concept have been described above with reference to the drawings. Although particular terms are used to describe the embodiments, they are merely used to describe the technical idea of the inventive concept and are not intended to limit the scope of the inventive concept as described in the following claims. Therefore, those of ordinary skill in the art will understand that various modifications and other equivalent embodiments may be derived therefrom. Thus, the spirit and scope of the inventive concept should be defined by the appended claims.

While the inventive concept has been particularly shown and described with reference to embodiments thereof, it will be understood that various changes in form and details may be made therein without departing from the spirit and scope of the following claims.

What is claimed is:

1. A control circuit comprising a zero-temperature coefficient (ZTC) estimator which is configured to estimate a ZTC voltage for an oscillator based on a supply voltage supplied to the oscillator and a frequency of an oscillation signal output by the oscillator,
wherein the ZTC voltage is a value of a magnitude of the supply voltage of the oscillator which corresponds to a ZTC condition of the oscillator,
wherein the ZTC estimator is configured to generate a bias control signal such that the magnitude of the supply voltage becomes the ZTC voltage.

2. The control circuit of claim 1, wherein the ZTC estimator is configured to generate the bias control signal such that the magnitude of the supply voltage has two or more different values at each of a first temperature of the oscillator and a second temperature different from the first temperature, and to estimate the ZTC voltage based on two or more frequencies of the oscillation signal corresponding respectively to the two or more different values.

3. The control circuit of claim 2, wherein the ZTC estimator comprises:
first and second storage devices which are configured to store first and second frequencies of the oscillation signal corresponding respectively to first and second voltages while the oscillator operates at the first temperature;
third and fourth storage devices which are configured to store third and fourth frequencies of the oscillation signal corresponding respectively to third and fourth voltages while the oscillator operates at the second temperature; and
an operation circuit which is configured to estimate the ZTC voltage based on the first to fourth voltages and the first to fourth frequencies stored in the first to fourth storage devices.

4. The control circuit of claim 3, wherein the operation circuit is configured to determine a cross point in a graph having two axes respectively representing the supply voltage and the frequency, the cross point being between a first line formed by the first and second voltages and the first and second frequencies, and a second line formed by the third and fourth voltages and the third and fourth frequencies, and wherein the operation circuit is further configured to estimate the ZTC voltage based on the cross point.

5. The control circuit of claim 4, wherein the operation circuit is configured to estimate a voltage corresponding to the cross point as the ZTC voltage.

6. An apparatus, comprising:
a zero-temperature coefficient (ZTC) estimator which is configured to generate a bias control signal;
an oscillator which is configured to output an oscillation signal; and
a bias circuit which is configured to supply a supply voltage to the oscillator based on the bias control signal,
wherein the ZTC estimator is configured to estimate a ZTC voltage based on the supply voltage and a frequency of the oscillation signal, and to generate the bias control signal such that a magnitude of the supply voltage becomes the ZTC voltage, and
wherein the ZTC voltage is a value of the magnitude of the supply voltage of the oscillator satisfying a ZTC condition of the oscillator.

7. The apparatus of claim 6, wherein the ZTC estimator is configured to:
generate the bias control signal such that first and second voltages are supplied to the oscillator at different times while the oscillator operates at a first temperature,
generate the bias control signal such that third and fourth voltages are supplied to the oscillator at different times while the oscillator operates at a second temperature different from the first temperature, and
estimate the ZTC voltage based on the first to fourth voltages and first to fourth frequencies of the oscillation signal corresponding to the first to fourth voltages.

8. The apparatus of claim 7, further comprising a temperature sensor configured to generate a temperature signal by sensing a temperature of the oscillator,
wherein the ZTC estimator recognizes the first and second temperatures based on the temperature signal.

9. The apparatus of claim 6, wherein:
the oscillator is configured to adjust the frequency of the oscillation signal based on a frequency control signal, and
the apparatus further comprises a frequency controller configured to generate the frequency control signal such that the oscillation signal has a predetermined target frequency, based on the frequency of the oscillation signal, upon completion of estimation of the ZTC voltage by the ZTC estimator.

10. The apparatus of claim 9, wherein the frequency controller is configured to maintain the frequency control signal to be constant while the ZTC voltage is estimated by the ZTC estimator.

11. The apparatus of claim 9, wherein:
the frequency control signal comprises a digital signal, and
the oscillator comprises a digitally controlled oscillator (DCO).

12. A method comprising:
controlling a supply voltage supplied to an oscillator, and acquiring a frequency of an oscillation signal output by the oscillator in response to the controlled supply voltage;
estimating a zero-temperature coefficient (ZTC) voltage based on the supply voltage and the frequency of the oscillation signal, wherein the ZTC voltage is a value of a magnitude of the supply voltage of the oscillator corresponding to a ZTC condition of the oscillator; and
generating a bias control signal such that the magnitude of the supply voltage becomes the ZTC voltage.

13. The method of claim 12, wherein
the acquiring of the frequency comprises generating the bias control signal such that the magnitude of the supply voltage supplied to the oscillator has two or more different values at each of a first temperature of the oscillator and a second temperature different from the first temperature, and acquiring two or more frequencies of the oscillation signal corresponding respectively to the two or more different values, and
the estimating of the ZTC voltage comprises estimating the ZTC voltage based on the two or more different values and the two or more frequencies.

14. The method of claim 13, wherein
the acquiring of the frequency further comprises recognizing first and second temperatures respectively at different times based on a temperature signal generated according to a temperature of the oscillator,
the acquiring of the two or more frequencies is performed at each of the first and second temperatures, and
the estimating of the ZTC voltage is performed based on four or more frequencies acquired at the first and second temperatures.

15. The method of claim 14, wherein the estimating of the ZTC voltage comprises:
determining a cross point between a first line formed by first and second voltages and first and second frequencies acquired respectively at the first and second voltages at the first temperature; and a second line formed by third and fourth voltages and third and fourth frequencies acquired respectively at the third and fourth voltages at the second temperature, in a graph having two axes respectively representing the supply voltage and the frequency; and
estimating the ZTC voltage based on the cross point.

16. The method of claim 15, wherein the estimating of the ZTC voltage includes estimating the ZTC voltage as the magnitude of the supply voltage corresponding to the cross point.

17. The method of claim 15, wherein
the first and third voltages are equal to each other, and
the second and fourth voltages are equal to each other.

18. The method of claim 17, wherein
the estimating of the ZTC voltage further comprises determining a fifth voltage between the first voltage and the magnitude of the supply voltage corresponding to the cross point, and a sixth voltage between the second voltage and the magnitude of the supply voltage corresponding to the cross point,
the method further comprises:
generating the bias control signal such that the magnitude of the supply voltage becomes the fifth and sixth voltages at each of a third temperature and a fourth temperature different from the third temperature, and
acquiring four frequencies of the oscillation signal corresponding respectively to four combinations of the third and fourth temperatures and the fifth and sixth voltages, and
the estimating of the ZTC voltage estimates the ZTC voltage based on the fifth and sixth voltages and the four frequencies.

19. The method of claim 12, further comprising outputting the supply voltage in response to the bias control signal.

20. The method of claim 12, further comprising:
maintaining a frequency control signal for controlling the frequency of the oscillation signal to be constant, before the estimating of the ZTC voltage; and
generating the frequency control signal such that the oscillation signal has a predetermined target frequency, after the generating of the bias control signal to supply the ZTC voltage.

* * * * *